United States Patent [19]
Frisch et al.

[11] Patent Number: 5,793,642
[45] Date of Patent: Aug. 11, 1998

[54] HISTOGRAM BASED TESTING OF ANALOG SIGNALS

[75] Inventors: Arnold M. Frisch, Portland; Thomas A. Almy, Tualatin, both of Oreg.

[73] Assignee: Tektronix, Inc., Wilsonville, Oreg.

[21] Appl. No.: 784,640

[22] Filed: Jan. 21, 1997

[51] Int. Cl.[6] ................................................. H04B 1/16
[52] U.S. Cl. .................................... 364/490; 364/490
[58] Field of Search .................................... 364/487, 485, 364/490

[56] References Cited

U.S. PATENT DOCUMENTS

| | | | |
|---|---|---|---|
| 4,890,237 | 12/1989 | Bales et al. | 364/485 |
| 4,985,844 | 1/1991 | Foley et al. | 364/487 |
| 5,081,592 | 1/1992 | Jenq | 364/487 |

Primary Examiner—Emanuel Todd Voeltz
Assistant Examiner—Matthew Smithers
Attorney, Agent, or Firm—Boulden G. Griffith; Thomas F. Lenihan

[57] ABSTRACT

A method for evaluating an electrical signal is disclosed. This method is especially useful for evaluating analog signals within an integrated circuit or other inaccessible location. A reference histogram is derived from either a simulation of a desired waveform or from sampling a desired waveform signal. This reference histogram is subtracted from a test results histogram to produce a variance histogram. The variance histogram can be further evaluated to determine characteristics of the electrical signal under test and/or to produce a figure of merit for the circuitry producing the signal under evaluation. Before the difference between the test results histogram and the reference histogram is taken, normalization, offset calculation, gain adjustment, and noise floor adjustment may be performed on the test results histogram, and these values may be exported to further aid in characterization of the signal under evaluation.

18 Claims, 23 Drawing Sheets

HISTOGRAM BASED TESTING OF ANALOG SIGNALS

CROSS-REFERENCE TO RELATED APPLICATIONS

Not applicable

STATEMENT REGARDING FEDERALLY SPONSORED RESEARCH OR DEVELOPMENT

Not applicable

FIELD OF THE INVENTION

This invention relates to the testing of analog electrical signals, and more particularly to a method for testing analog electrical signals in an inaccessible environment such as embedded within an integrated circuit.

BACKGROUND OF THE INVENTION

As integrated circuits (ICs) have gotten more and more dense, and as multiple integrated circuits are more densely packed into multi-chip modules (MCMs), input/output capabilities have become much more scarce relative to the increasing amount of circuitry to be tested. Consequently, there has been a growing need for built-in self-test (BIST) capabilities. As the name implies, built-in self-test refers to the inclusion of test and measurement circuitry inside the IC or MCM along with the functional circuitry designed to serve some other purpose. The data and commands to initiate testing, as well as the results of tests performed, can be moved through a relatively small number of input/output (I/O) pins, e.g., pins that are part of a boundary scan bus.

While considerable progress has been made in connection with the built-in self-testing of digital circuitry, the built-in self-testing of analog circuits has been less thoroughly developed and is generally more problematical. Most of the present approaches assume the use of external automated test equipment and some means of delivering the analog signal from the terminals of an IC or MCM to the external equipment. Pass/fail testing of analog signals in more accessible environments is typically accomplished by comparing digitized signal values with minimum and maximum acceptable values from a signal template. However, implementing such an approach in connection with signals deep within an IC or MCM is prohibitively complicated and expensive. What is very much needed is a simple and cost-effective method for performing at-speed pass/fail (go/no-go) testing of analog signals that are internal to an IC or MCM and therefore unavailable for testing by conventional external means.

The availability of tools for built-in self-testing of circuitry embedded within ICs or MCMs has growing increasing in recent years. An analog probe system suitable for use embedded in an integrated circuit is described in U.S. Pat. No. 5,418,470 to Frisch for "Analog Multi-Channel Probe System", hereby incorporated by reference. Another patent issued to Frisch, U.S. Pat. No. 4,774,681 for "Method and Apparatus for Providing a Histogram", hereby incorporated by reference, describes a histogram-generating circuit implementation that will be seen below to be adaptable to the solution of the present problem.

Histograms have historically been used in a variety of ways. U.S. Pat. No. 5,097,428 to Crosby for "Data Occurrence Frequency Analyzer", hereby incorporated by reference, describes how a histogram can be used to summarize the data sorted by the data sorting apparatus of the invention claimed in that patent. U.S. Pat. No. 4,985,844 to Foley et al. for "Statistical Waveform Profiler Employing Counter/Timer", hereby incorporated by reference, describes an approach to generating a voltage histogram of a repetitive waveform. Similarly, U.S. Pat. No. 4,890,237 to Bales et al. for "Method and Apparatus for Signal Processing", hereby incorporated by reference, describes how a histogram may be used to produce intensity variations representing the number of times that particular combinations of power and frequency occur. U.S. Pat. No. 5,550,963 to Siegel et al. for a "Graded Display of Digitally Compressed Waveforms", hereby incorporated by reference, describes how histograms are used in the process of producing analog-like intensity displays in a digital storage oscilloscope.

U.S. Pat. No. 5,003,248 to Johnson for "Probability Density Histogram", hereby incorporated by reference, describes how a histogram display can be used to supplement a conventional time-versus-voltage oscilloscope display. In a similar vein, U.S. Pat. No. 5,343,405 to Kucera et al. for "Automatic Extraction of Pulse-Parametrics From Multi-Valued Functions", hereby incorporated by reference, describes how a histogram can be used to show the behavior over time of a repetitive signal. U.S. Pat. No. 5,495,168 to deVries for "Method of Signal Analysis Employing Histograms to Establish Stable, Scaled Displays in Oscilloscopes", hereby incorporated by reference, describes how histograms can be used to automatically or manually control the settings of an oscilloscope.

SUMMARY OF THE INVENTION

The present invention is a method for evaluating the quality of an electrical signal. This method is especially useful for evaluating analog electrical signals within an integrated circuit or other inaccessible location. A reference histogram is derived from either a simulation of an ideal or desired signal or from sampling the desired signal itself. This reference histogram is subtracted from a test results histogram to produce a variance histogram. The variance histogram can be further evaluated to determine characteristics of the electrical signal under test and/or to produce a figure of merit for the circuitry producing the signal under evaluation. Before the difference between the test results histogram and the reference histogram is taken, normalization, offset calculation, gain adjustment, and noise floor adjustment may be performed on the test results histogram, and these values may be exported to further aid in characterization of the signal under evaluation.

DETAILED DESCRIPTION OF THE INVENTION

Figure 1:
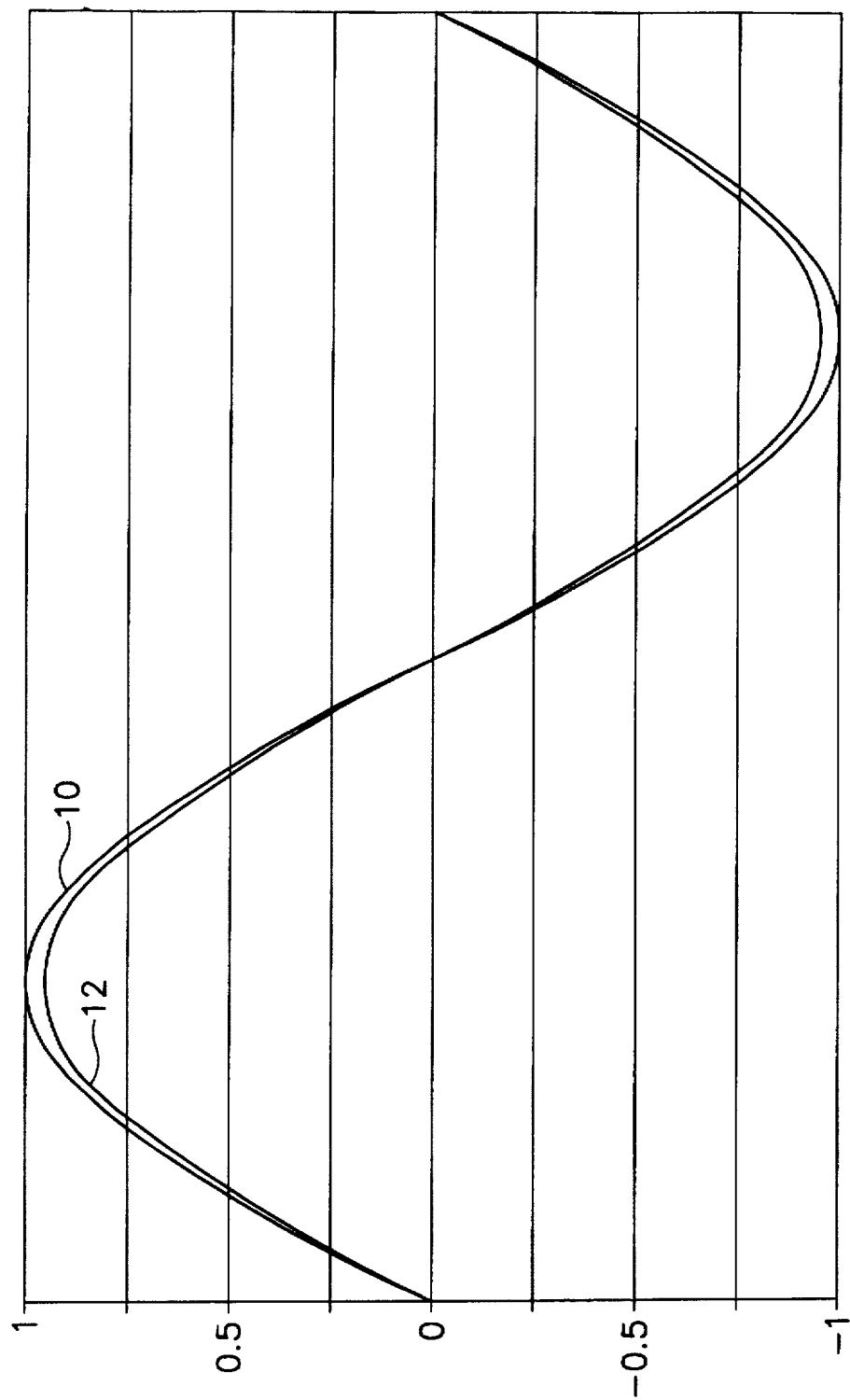
FIG. 1 shows a sine wave signal exhibiting low gain (and an ideal sine wave signal for reference).
Figure 2:
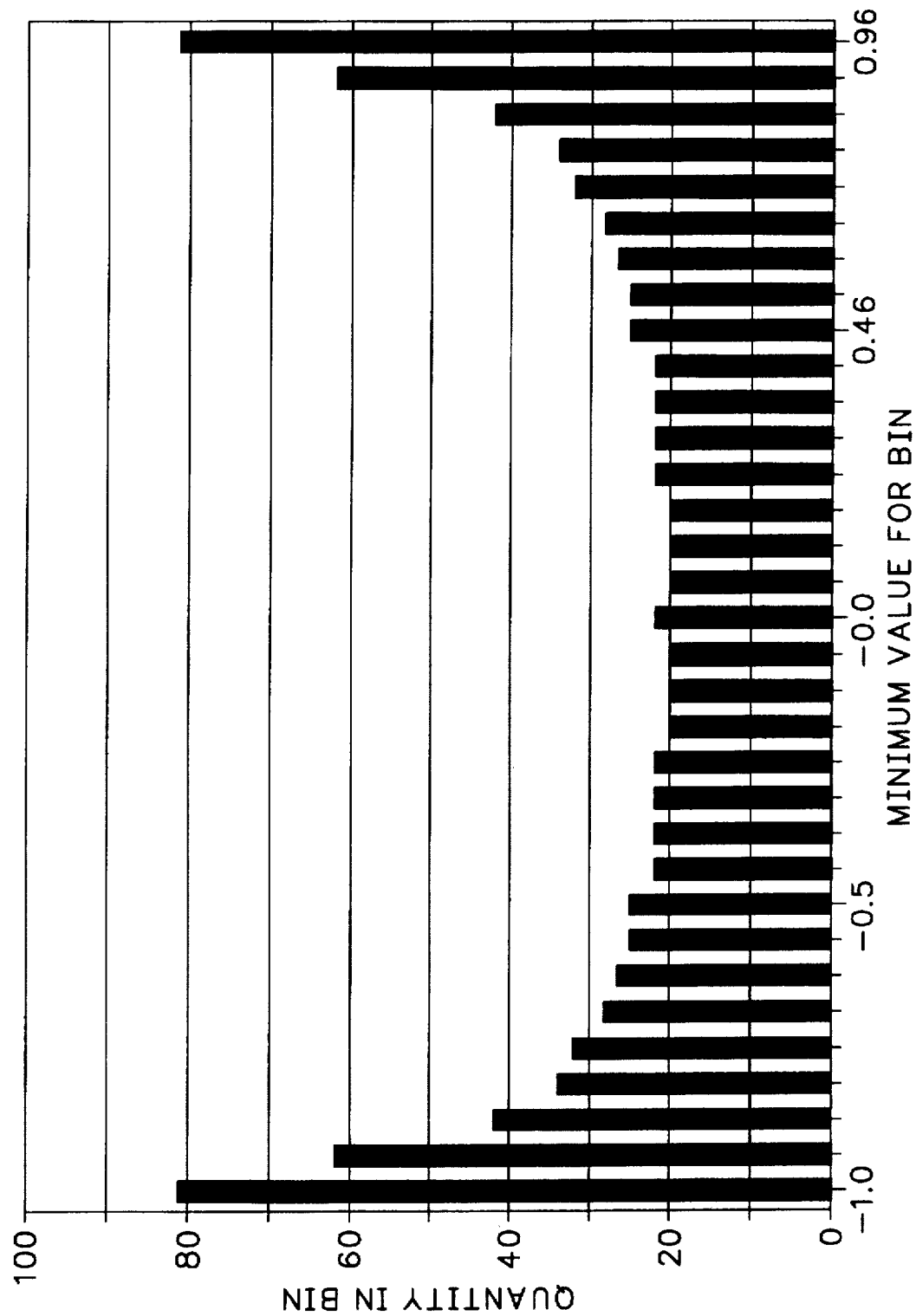
FIG. 2 shows a histogram representing the values of the desired sine waves shown for reference in FIGS. 1, 5, 8 and 11.
Figure 3:
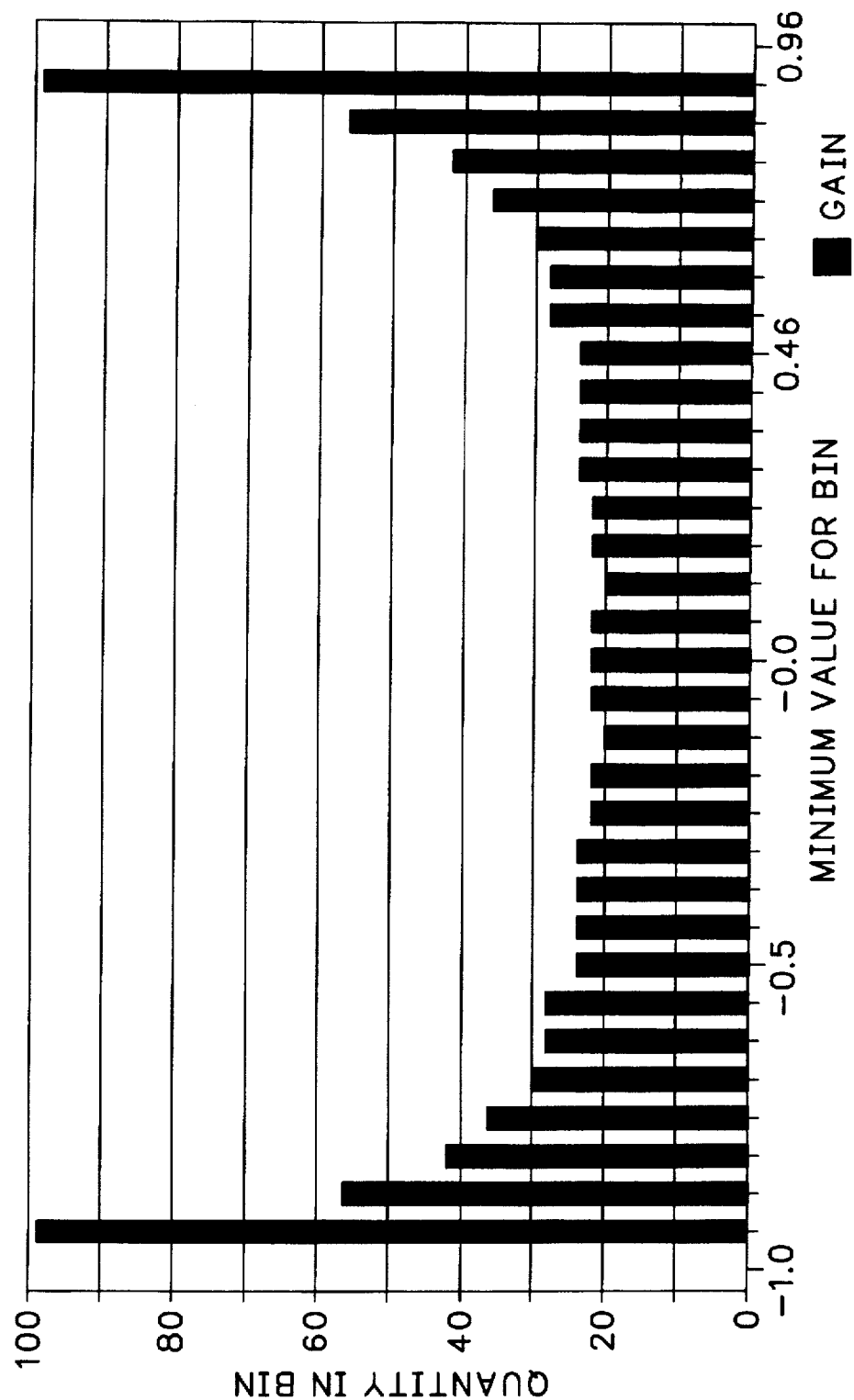
FIG. 3 shows a test results histogram for the low gain sine wave signal shown in FIG. 1.
Figure 4:
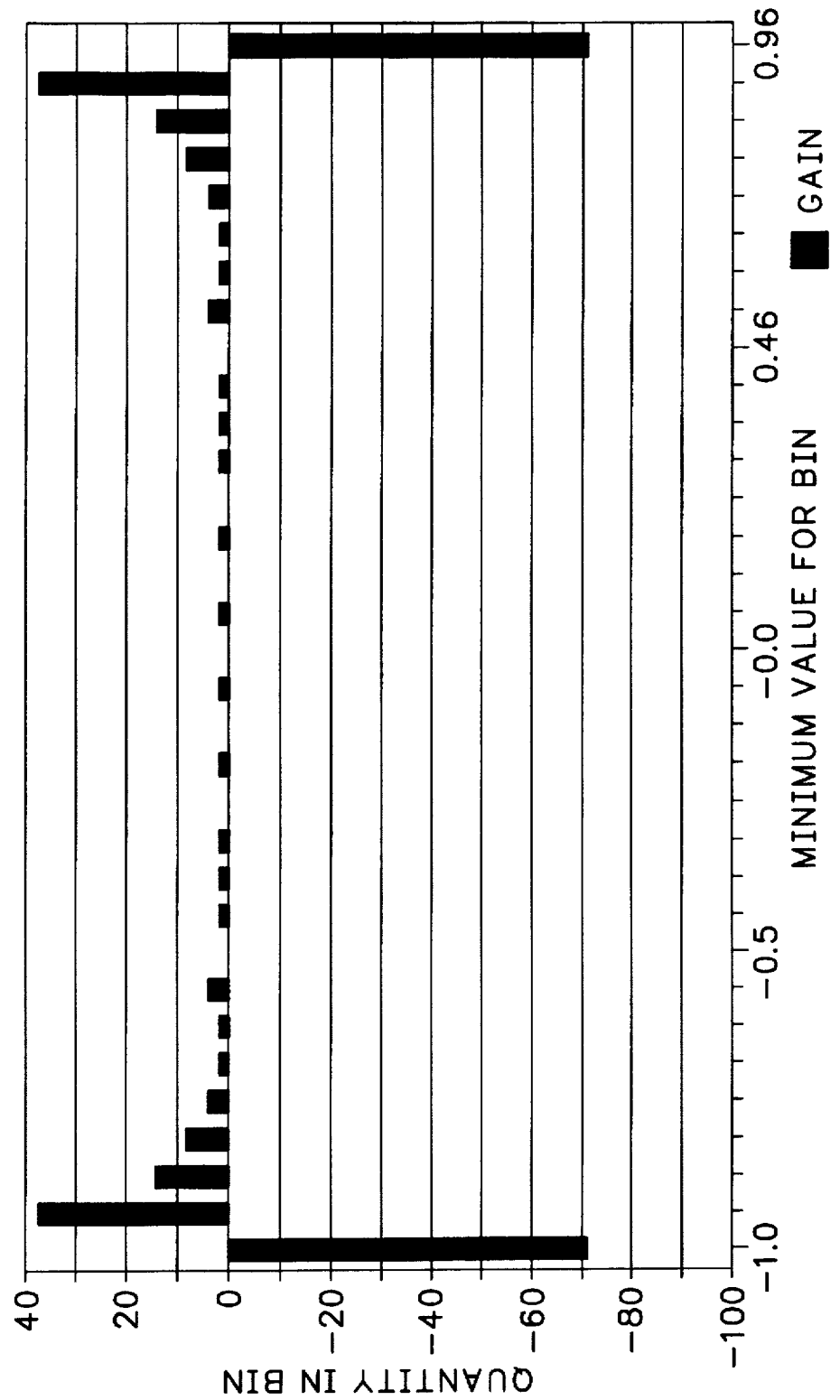
FIG. 4 shows a variance histogram for the low gain sine wave signal of FIG. 1.

FIG. 1 shows a single cycle of an ideal sine wave signal 10 (normalized to amplitudes of plus and minus one) and of a low gain sine wave signal 12. FIG. 2 shows a histogram of the voltage values of the ideal sine wave 10 shown in FIG. 1. This histogram of the voltage values of the ideal sine wave becomes the "reference histogram" for use in obtaining variance histograms according to the present invention. FIG. 3 shows a test results histogram for the low gain sine wave signal 12 shown in FIG. 1. FIG. 4 shows a variance histogram for the low gain sine wave signal 12 shown in FIG. 1. The values in this variance histogram are obtained by subtracting the reference histogram values from the test results histogram values.

Figure 5:
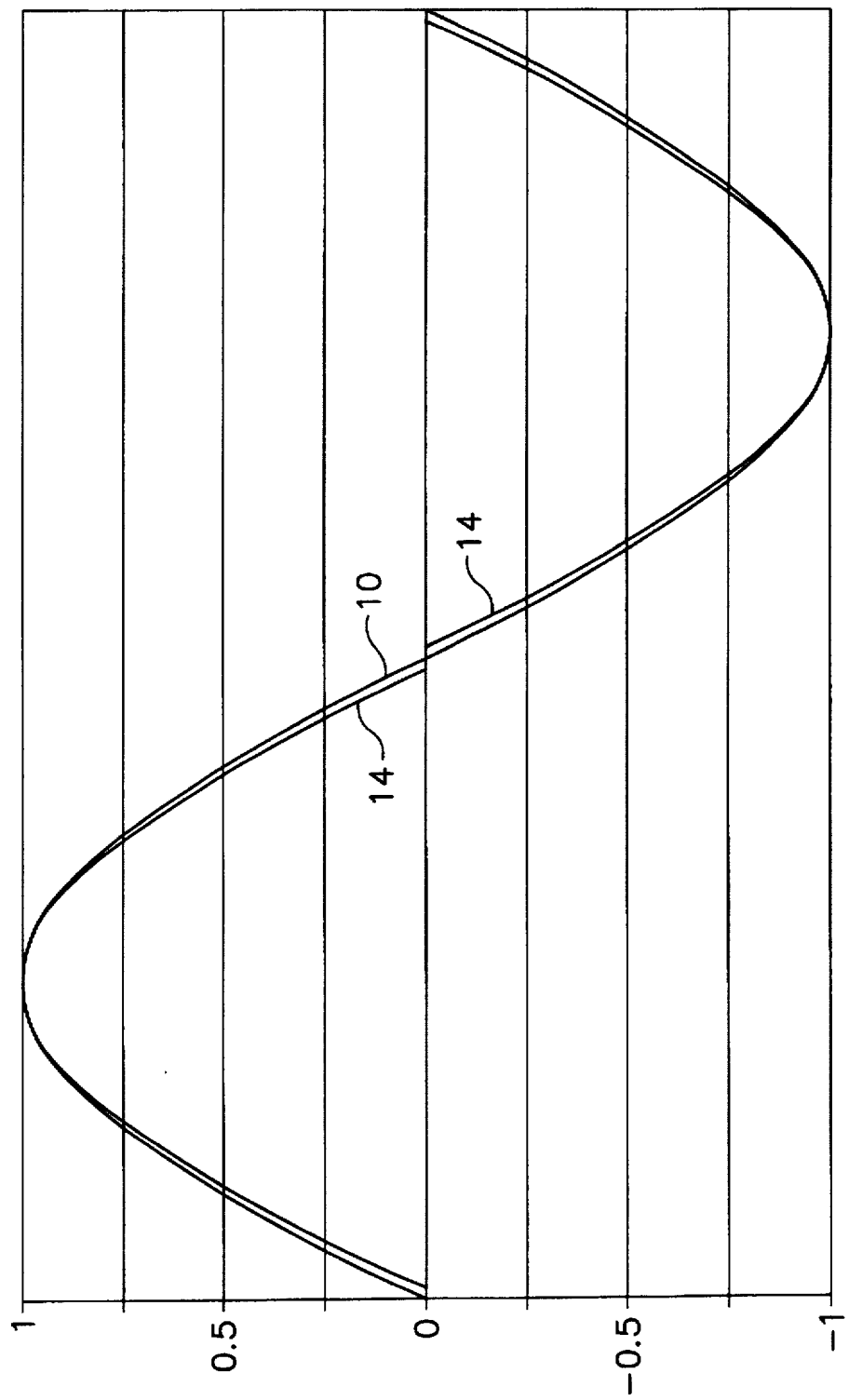
FIG. 5 shows a sine wave signal exhibiting crossover distortion (and an ideal or desired sine wave for reference).
Figure 6:
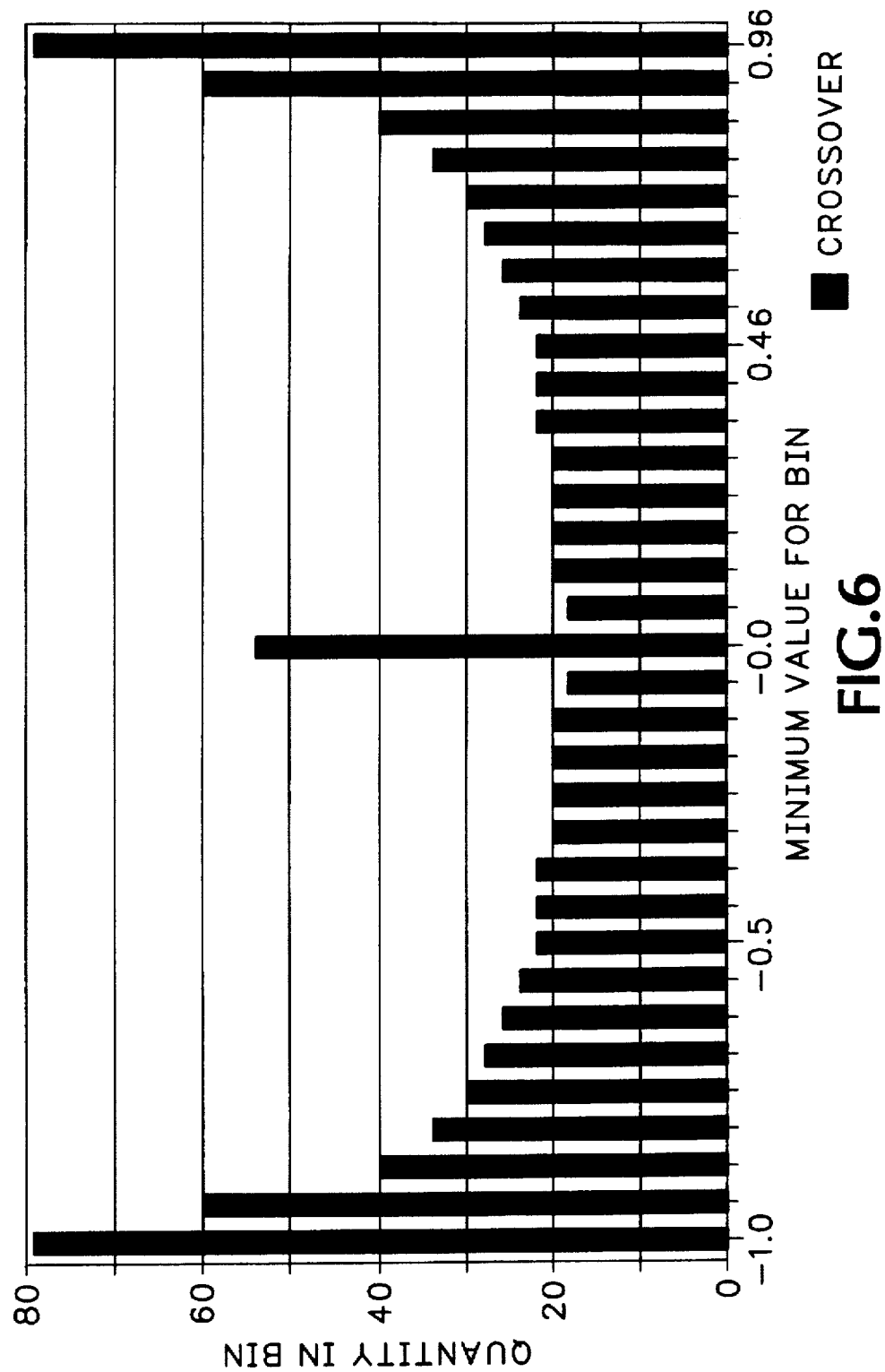
FIG. 6 shows a test results histogram for the sine wave signal with crossover distortion shown in FIG. 5.
Figure 7:
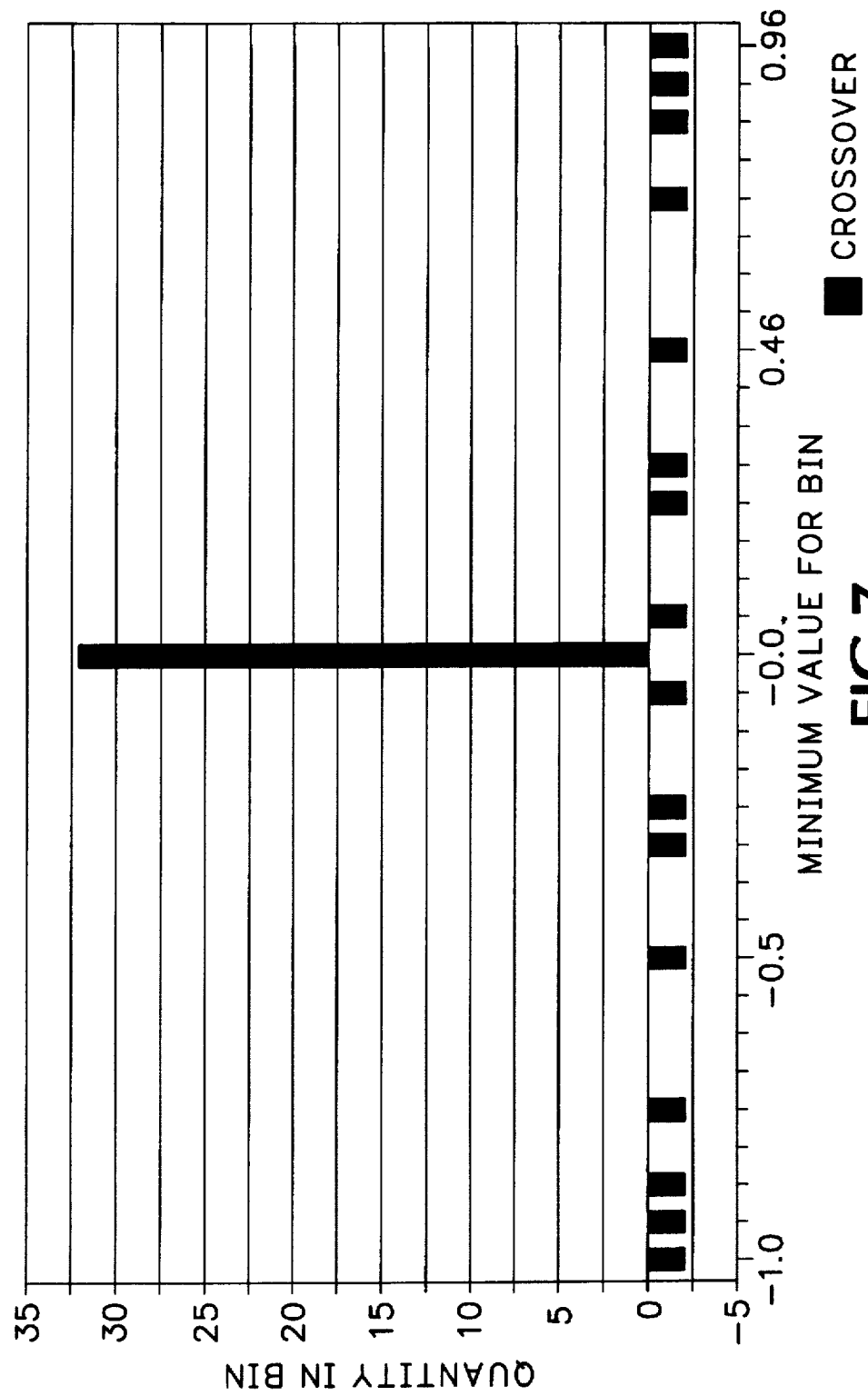
FIG. 7 shows a variance histogram for the sine wave signal with crossover distortion shown in FIG. 5.

FIG. 5 shows a sine wave signal 14 exhibiting crossover distortion, i.e., the loss of low level signals near the zero crossover points. FIG. 5 also shows an ideal (or desired) sine wave 10 for reference. FIG. 6 shows a test results histogram for the sine wave signal 14 exhibiting crossover distortion. FIG. 7 shows a variance histogram for the sine wave signal 14 exhibiting crossover distortion shown in FIG. 1. The values in this variance histogram are obtained by subtracting the reference histogram values from the test results histogram values.

Figure 8:
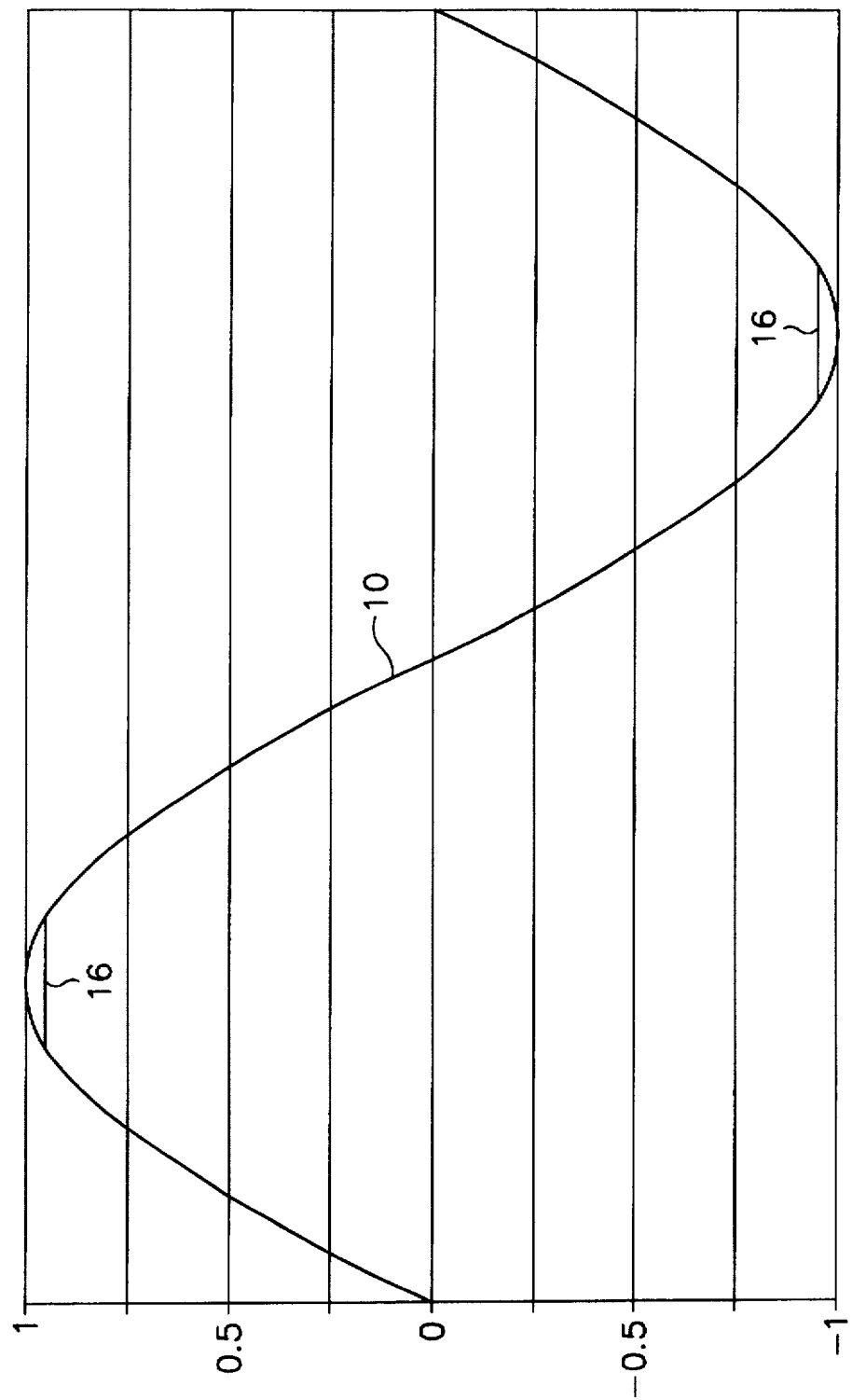
FIG. 8 shows a sine wave signal exhibiting clipping (and a desired sine wave signal for reference).
Figure 9:
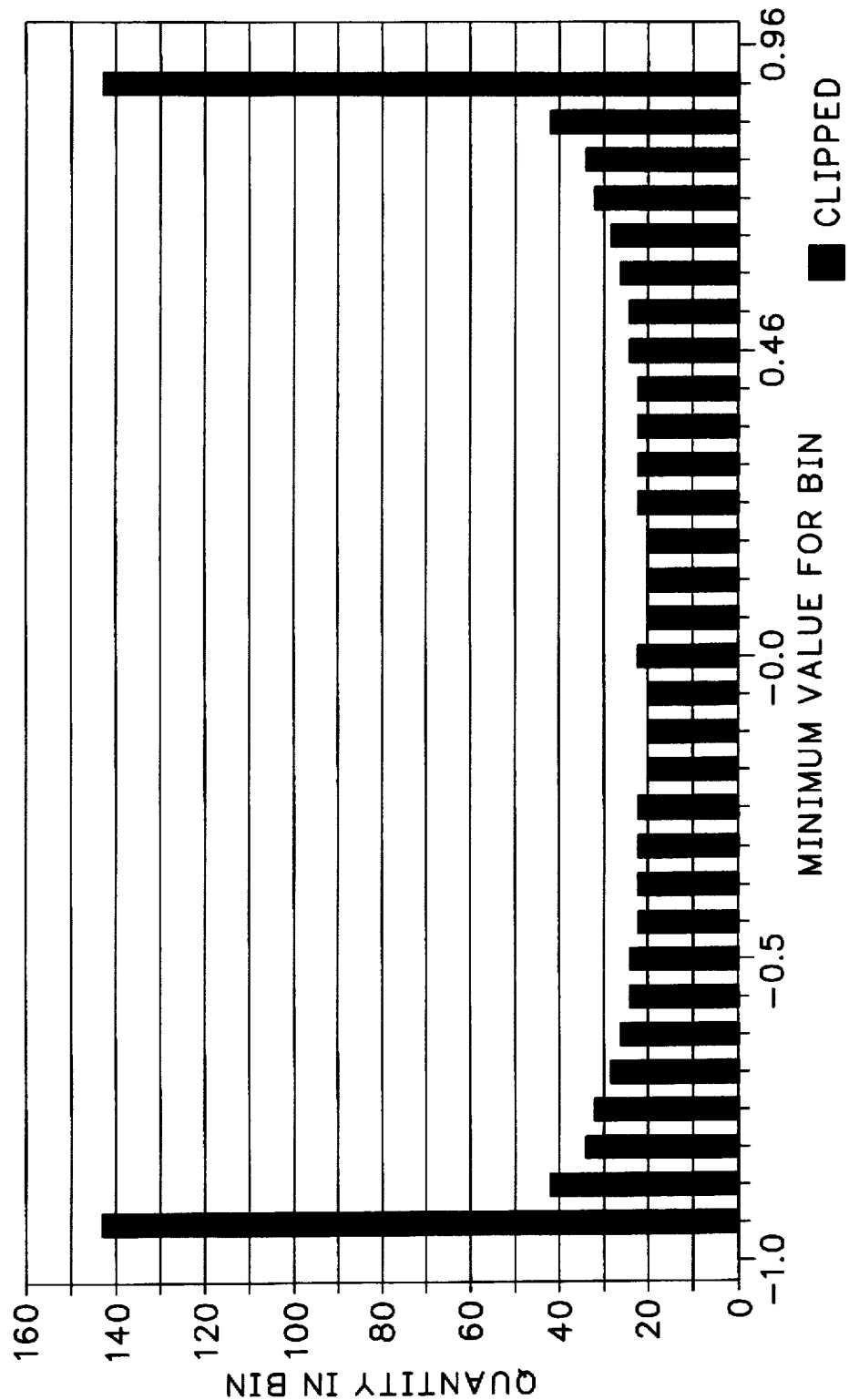
FIG. 9 shows a test results histogram for the clipped sine wave signal shown in FIG. 8.
Figure 10:
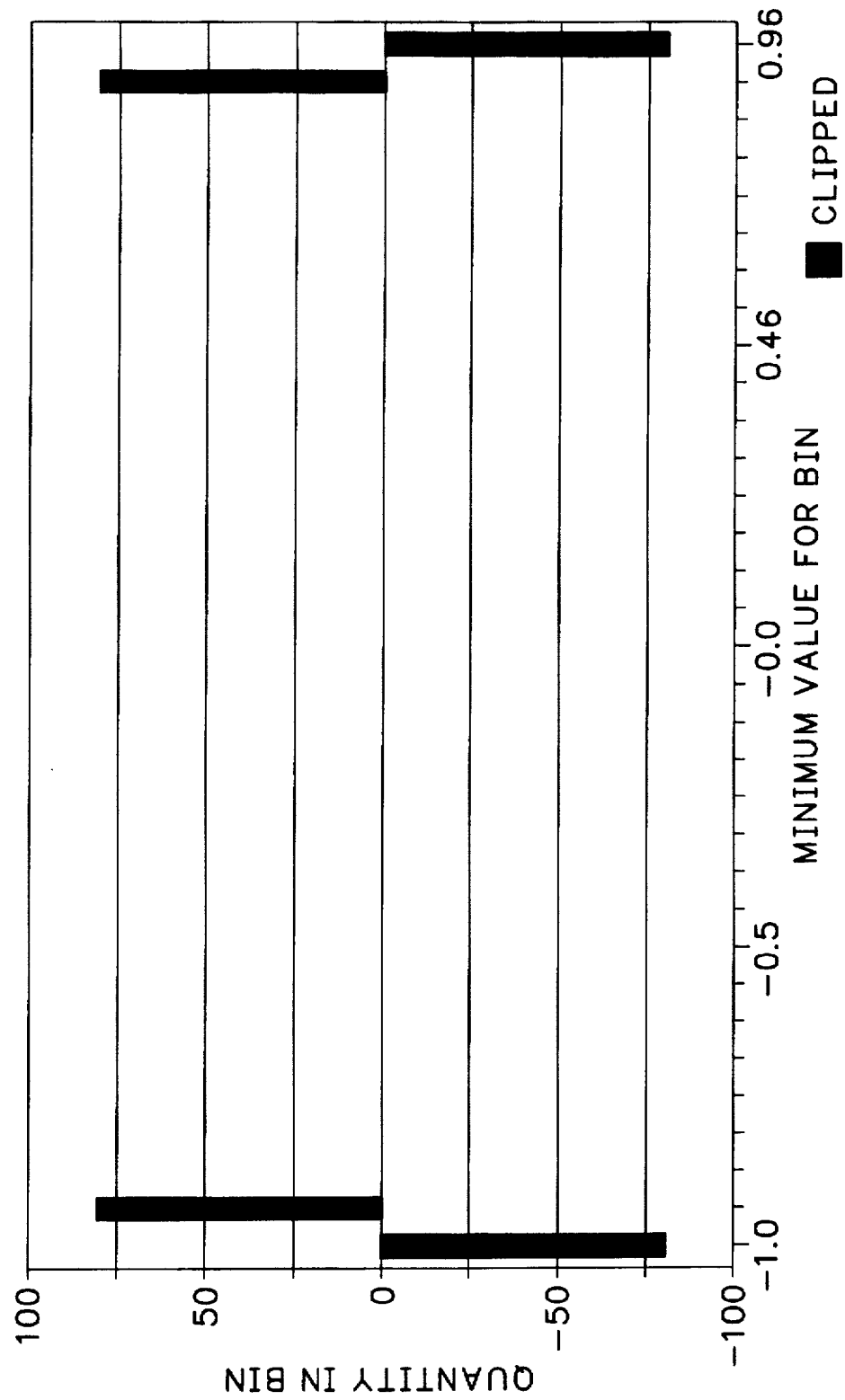
FIG. 10 shows a variance histogram for the clipped sine wave signal of FIG. 8.

FIG. 8 shows a sine wave signal 16 exhibiting "clipping", i.e., the loss of signal peaks at the maximum and minimum excursions of the signal. FIG. 8 also shows an ideal sine wave 10 for reference. At all points except those near the signal maximum and minimum waveforms 10 and 16 are coincident. FIG. 9 shows a test results histogram for the clipped sine wave signal 16 shown in FIG. 8. FIG. 10 shows a variance histogram for the clipped sine wave signal 16. The values in this variance histogram are obtained by subtracting the reference histogram values from the test results histogram values.

Figure 11:
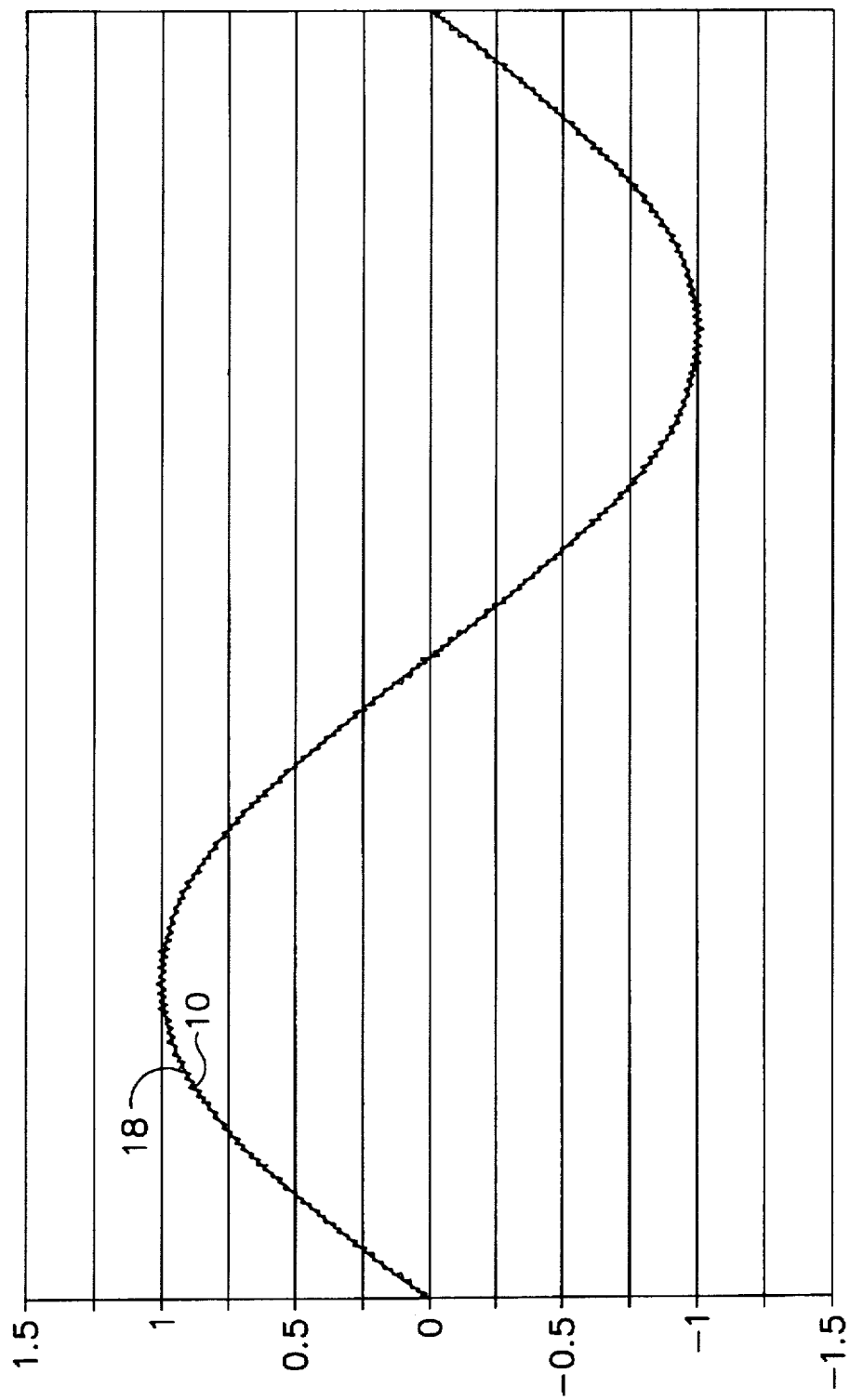
FIG. 11 shows a sine wave signal exhibiting noise (and a desired sine wave signal for reference).
Figure 12:
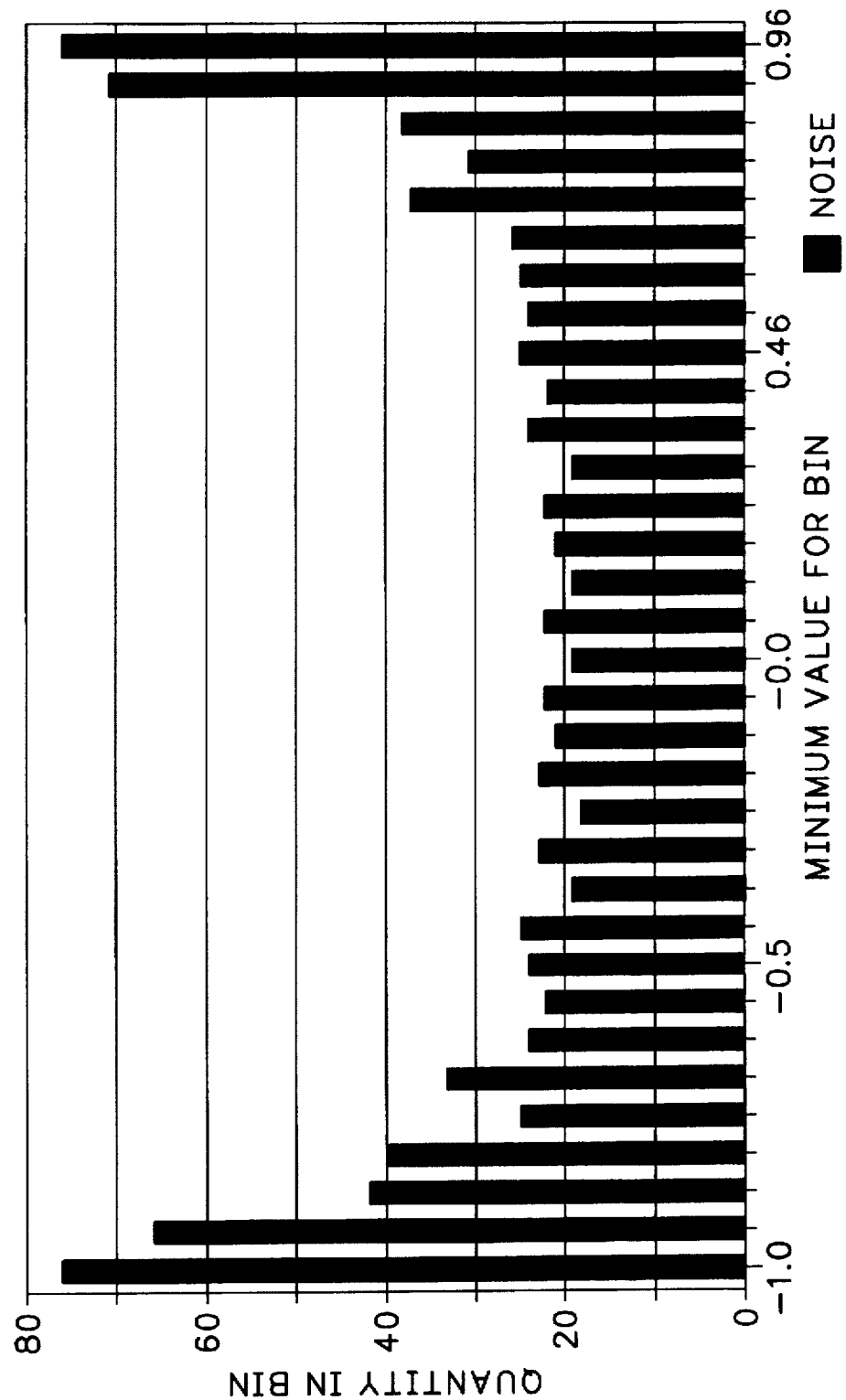
FIG. 12 shows a test results histogram for the noisy sine wave signal shown in FIG. 11.
Figure 13:
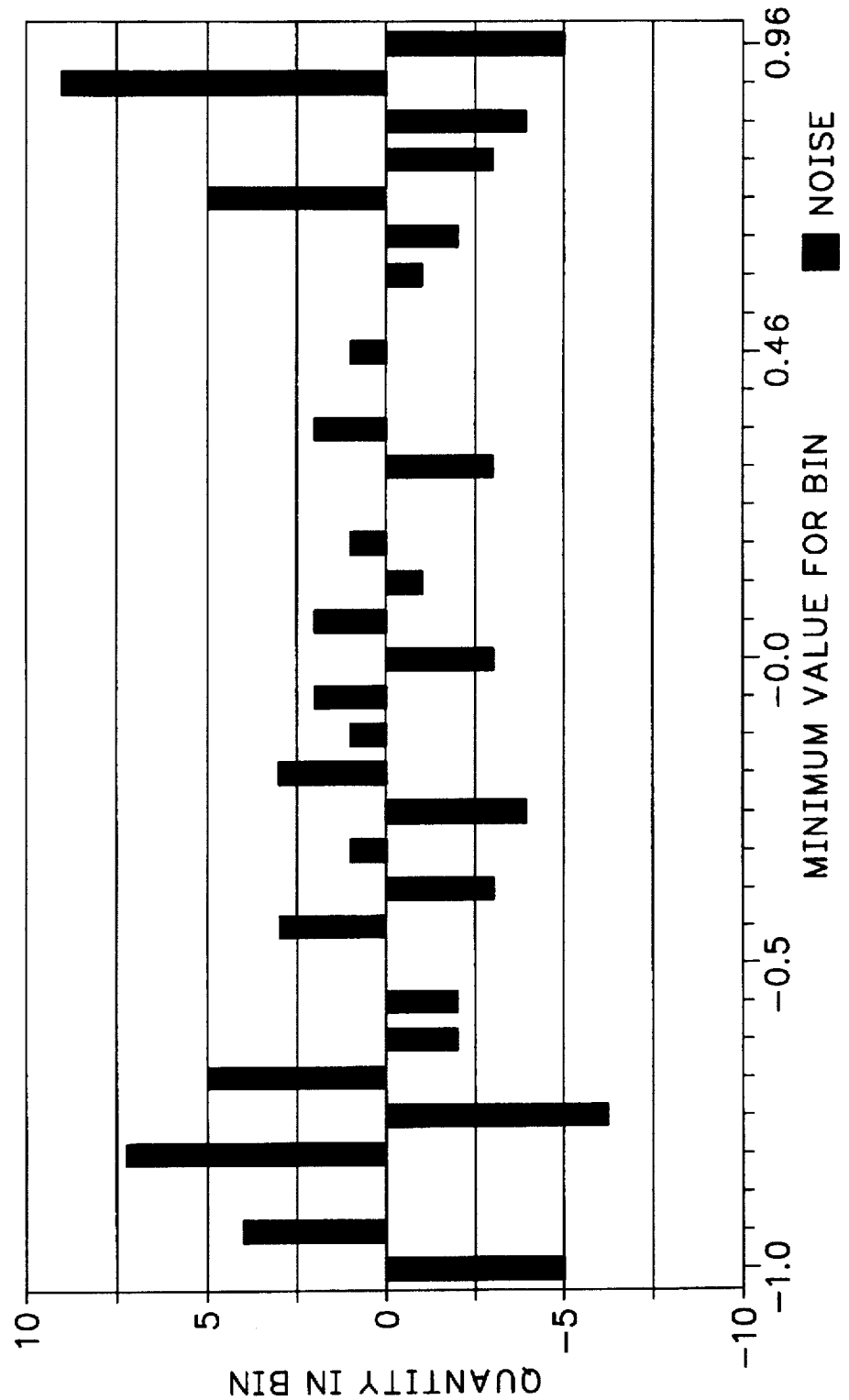
FIG. 13 shows a variance histogram for the noisy sine wave signal of FIG. 11.

FIG. 11 shows a sine wave signal 18 exhibiting a high level of noise. FIG. 11 also shows an ideal sine wave signal 10 for reference, but in most places it is obscured by the noisy sine wave signal 18. FIG. 12 shows a test results histogram for the noisy sine wave signal 18. FIG. 13 shows a variance histogram for the noisy sine wave signal 18. The values in this variance histogram are obtained by subtracting the reference histogram values from the test results histogram values.

Figure 14:
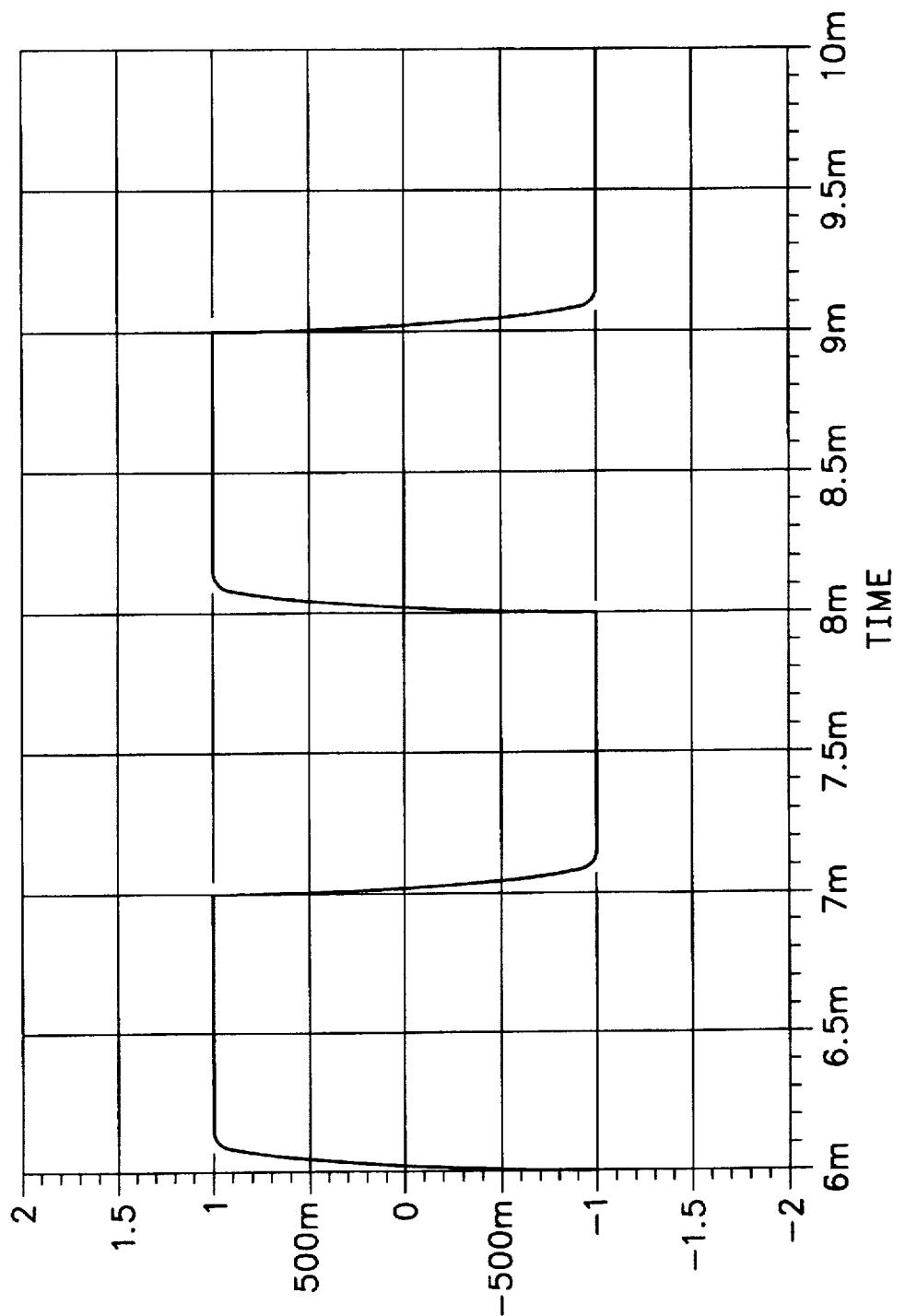
FIG. 14 shows a square wave signal exhibiting slow risetime.
Figure 15:
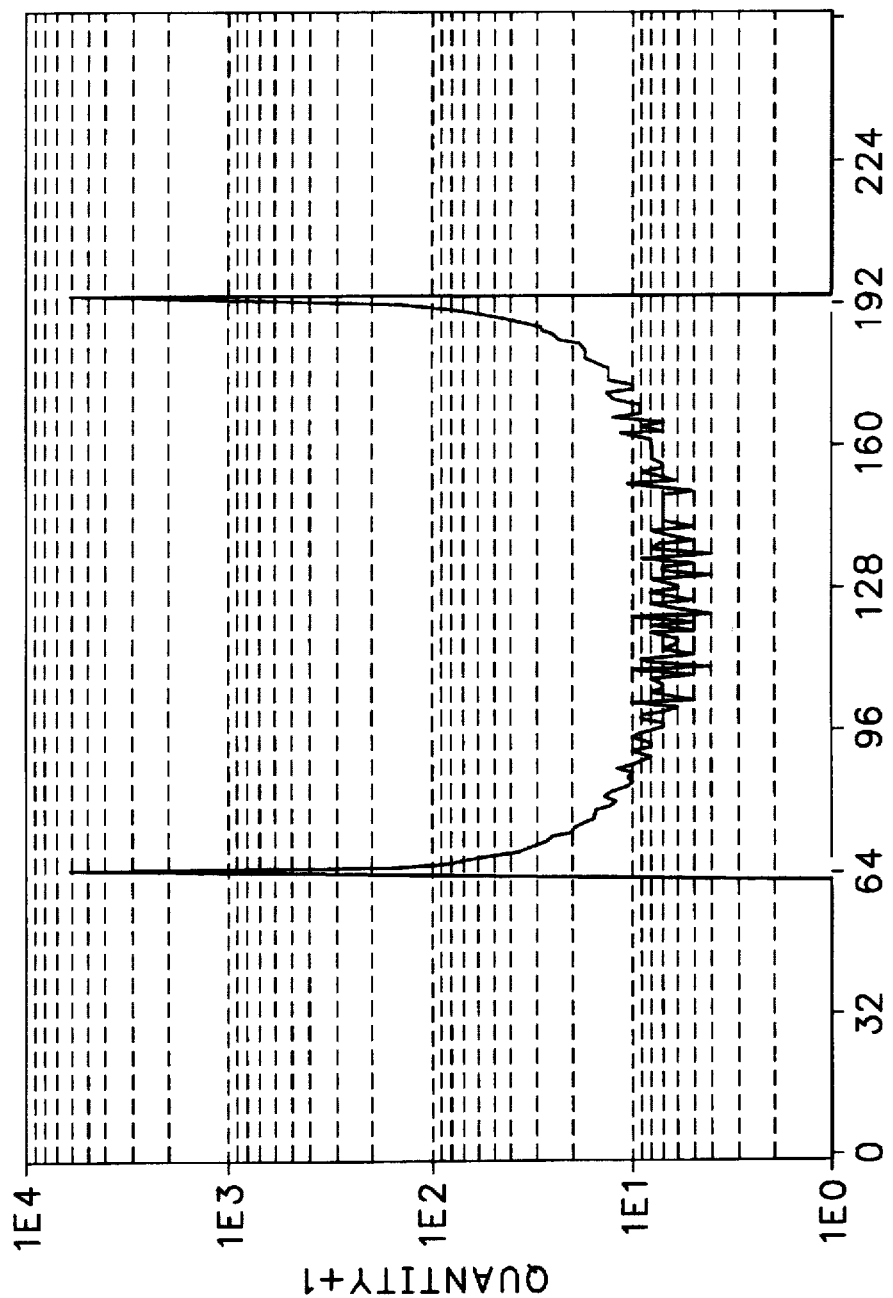
FIG. 15 shows a test results histogram for the square wave signal with a slow risetime shown in FIG. 14.

FIG. 14 shows a squarewave signal exhibiting a slow risetime (and an ideal squarewave signal superimposed on the graticule lines of the Figure and therefore not readily visible). No reference histogram is shown, but the reference histogram for an ideal squarewave signal may readily be produced by recognizing that such a histogram has all of its values in just two bins, one for the voltage at the top of the squarewave and one for the voltage at the bottom of the squarewave. A test results histogram for the squarewave exhibiting a slow risetime of FIG. 14 is shown in FIG. 15. After appropriate normalization, the theoretical ideal histogram results can be subtracted from this test results histogram to produce a difference histogram.

Figure 16:
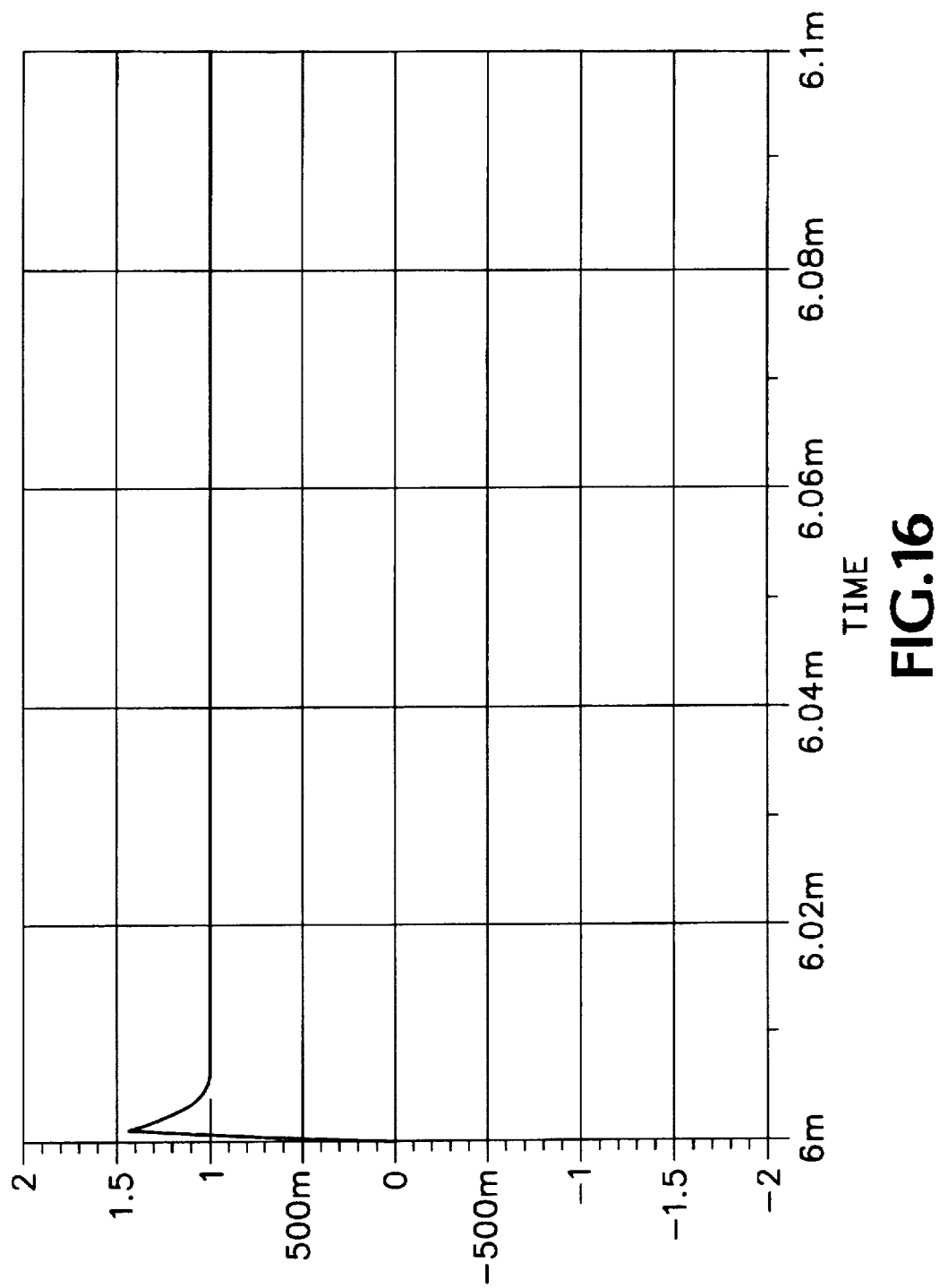
FIG. 16 shows a square wave signal exhibiting overshoot.
Figure 17:
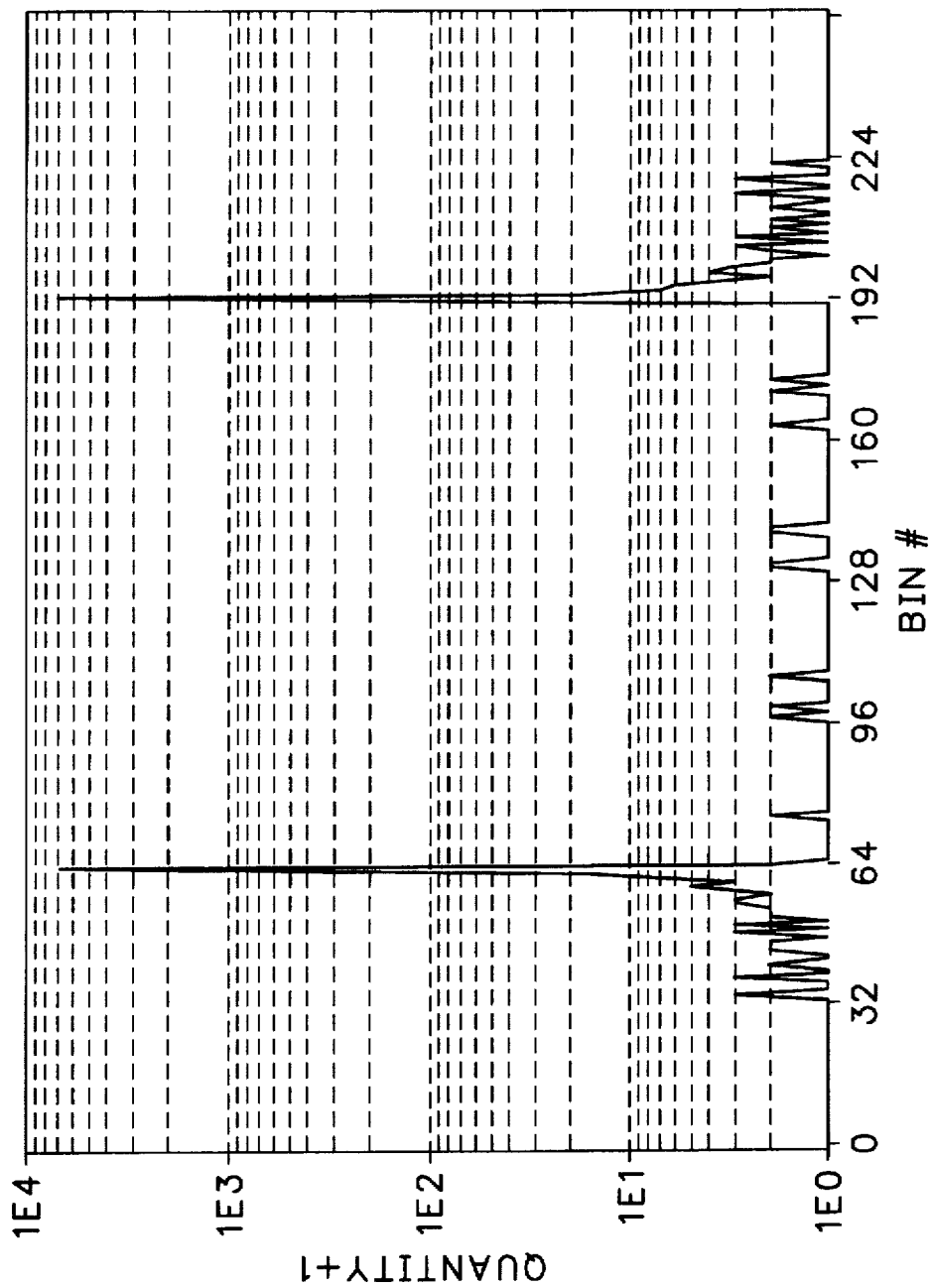
FIG. 17 shows a test results histogram for the square wave signal with overshoot shown in FIG. 16.

FIG. 16 shows a squarewave signal exhibiting overshoot (and an ideal squarewave signal superimposed on the graticule lines of the Figure and therefore not readily visible). Again, no reference histogram is shown, as the reference histogram for an ideal squarewave may readily be produced by recognizing that such a histogram has all of its values in just two bins, one for the voltage at the top of the squarewave and one for the voltage at the bottom of the squarewave. A test results histogram for the squarewave signal exhibiting overshoot of FIG. 16 is shown in FIG. 17. After appropriate normalization, the theoretical ideal histogram results can be subtracted from this test results histogram to produce a difference histogram.

Figure 18:
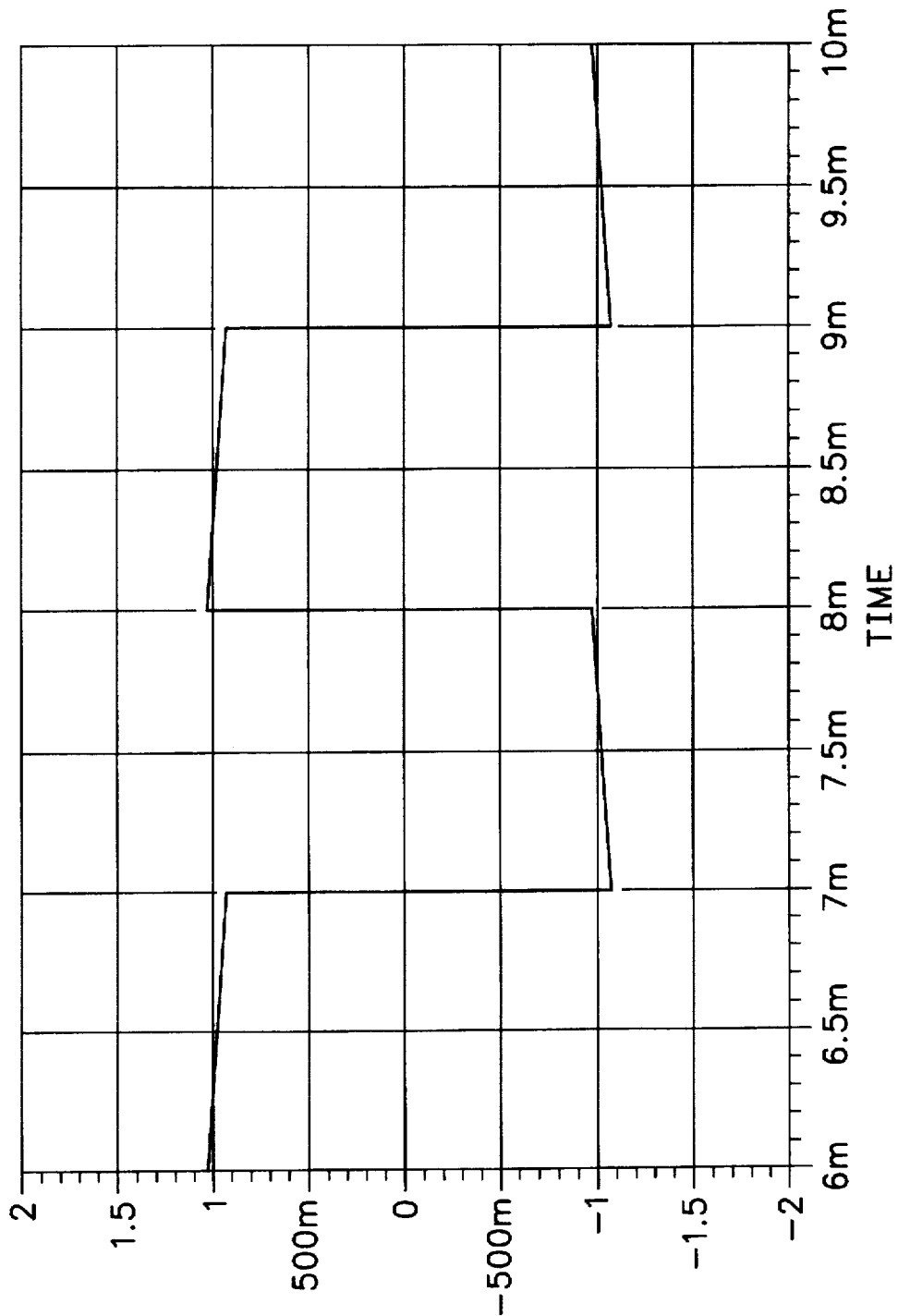
FIG. 18 shows a square wave signal exhibiting tilt.
Figure 19:
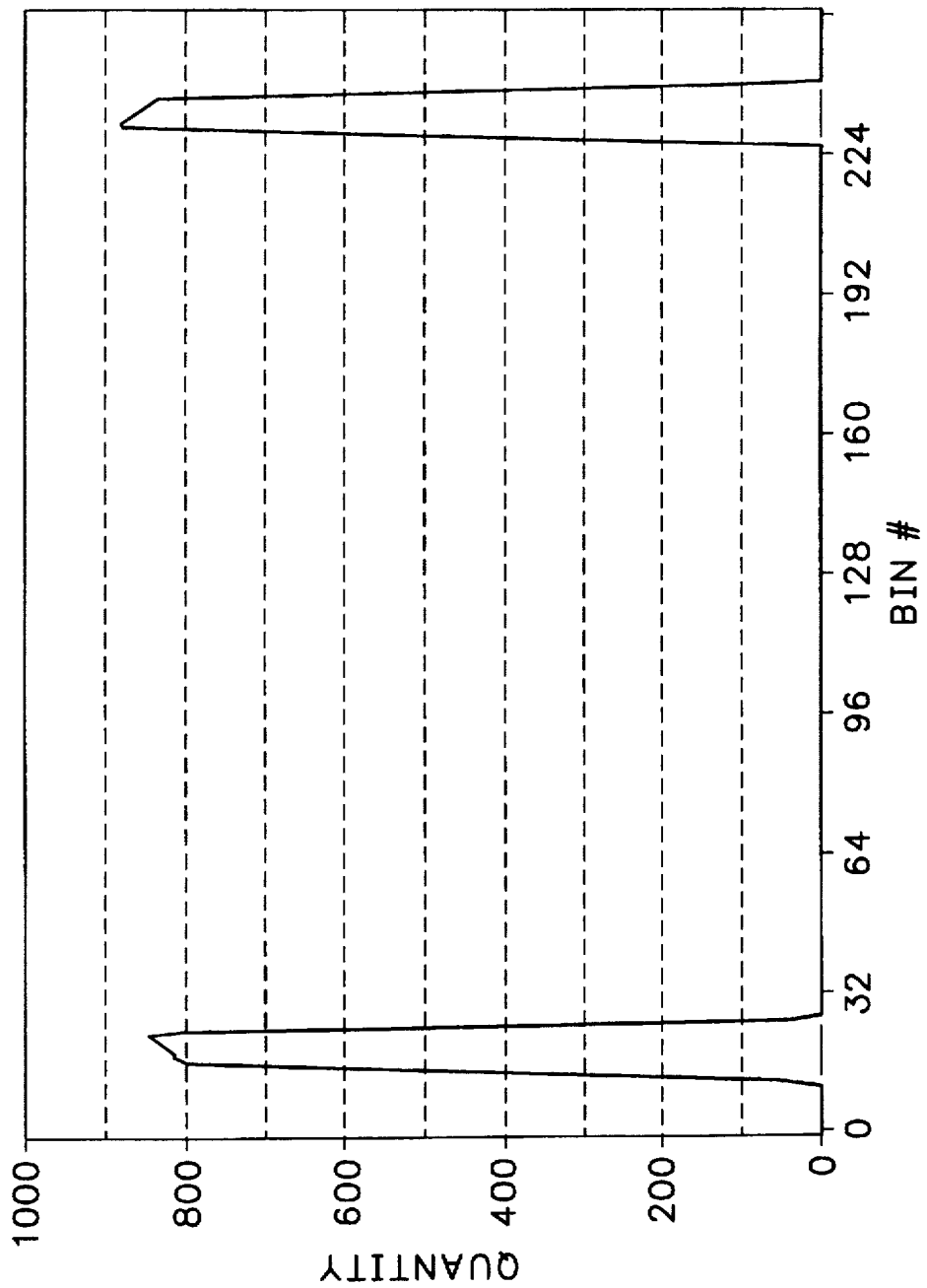
FIG. 19 shows a test results histogram for the square wave signal with tilt shown in FIG. 18.

FIG. 18 shows a squarewave signal exhibiting tilt (and an ideal squarewave signal superimposed on the graticule lines of the Figure and therefore not readily visible). Again, no reference histogram is shown, as the reference histogram for an ideal squarewave signal may readily be produced by recognizing that such a histogram has all of its values in just two bins, one for the voltage at the top of the squarewave and one for the voltage at the bottom of the squarewave. A test results histogram for the squarewave signal exhibiting tilt of FIG. 18 is shown in FIG. 19. After appropriate normalization, the theoretical ideal histogram results can be subtracted from this test results histogram to produce a difference histogram.

Figure 20:
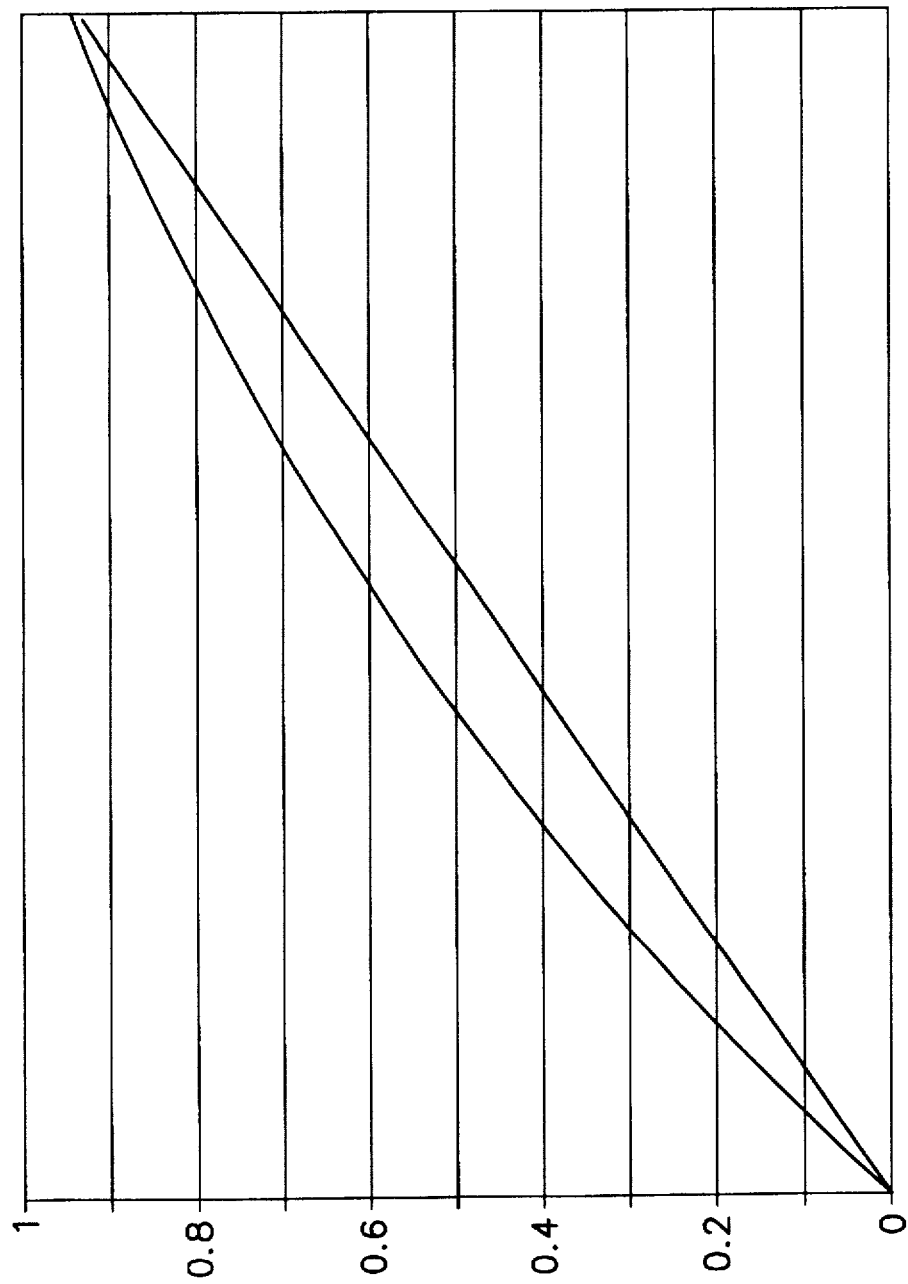
FIG. 20 shows a sawtooth signal exhibiting non-linearity (and a desired signal waveform for reference).
Figure 21:
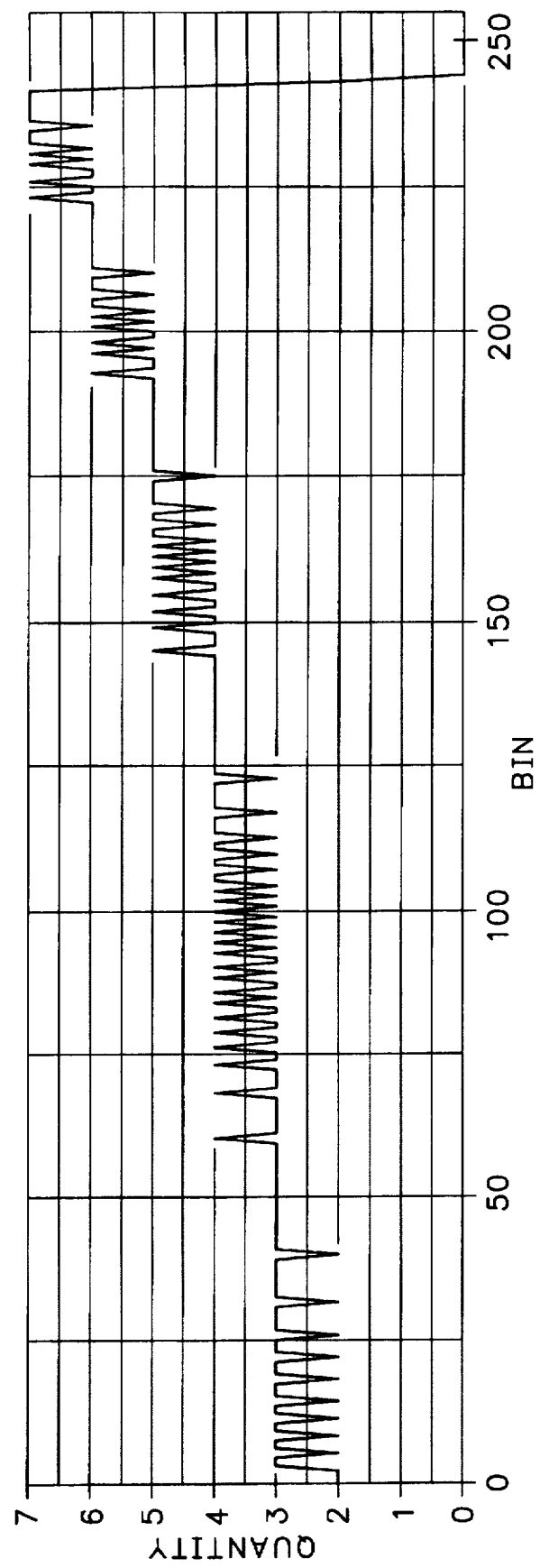
FIG. 21 shows a results histogram for the sawtooth signal exhibiting non-linearity.

FIG. 20 shows a sawtooth signal exhibiting non-linearity and an ideal sawtooth signal for comparison. Again, no reference histogram is shown, as the reference histogram for an ideal sawtooth signal may readily be produced by recognizing that such a histogram should have all of its values evenly distributed across all of the bins between zero and the maximum value of the sawtooth signal. A test results histogram for the sawtooth signal exhibiting non-linearity of FIG. 20 is shown in FIG. 21. After appropriate normalization, the theoretical ideal histogram results can be subtracted from this test results histogram to produce a difference histogram.

Figure 22:
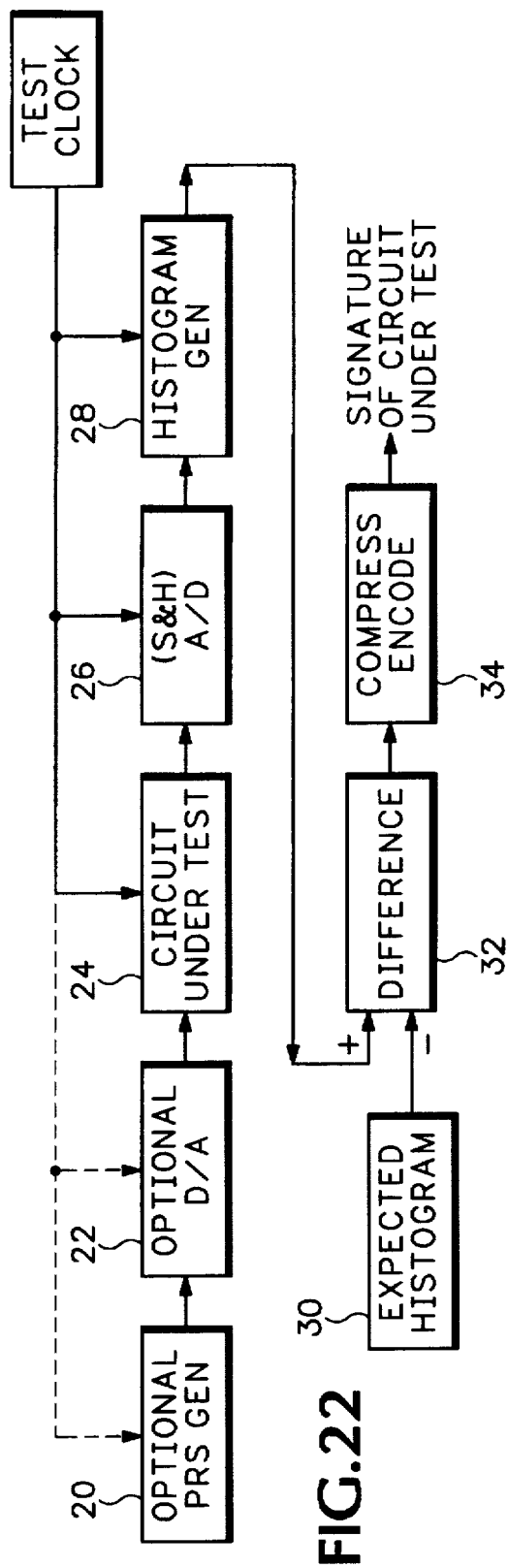
FIG. 22 is a high level block diagram showing a set of circuitry and software suitable for implementing the method of the present invention.

FIG. 22 is a high level block diagram showing a set of circuitry and software suitable for implementing the method of the present invention. The blocks 20-28 across the top of this Figure represent hardware circuits, while the blocks 30–34 at the bottom represent functions implemented in software. A conventional method of applying stimulus for analog BIST is to use a pseudo random signal generator and a digital-to-analog converter. If required, the pseudo-random sequence (PRS) generator 20 and the digital-to-analog converter (D/A) 22 are incorporated as shown.

The circuit under test 24 shown in FIG. 22 produces an output waveform to be monitored, whether or not its output is the result of stimulus or normal circuit activities. The output waveform from the circuit under test 24 is sampled and converted from analog levels to digital values by analog-to-digital converter 26 (which may or may not contain sample & hold circuitry, depending on the type of A/D converter and other factors). Those digital values are then supplied to histogram generator 28, which processes those values into a test results histogram of the voltage levels of the signal during a period of interest.

In the implementation shown, the rest of the processing of the test results histogram values is performed in software, but these functions could be performed in hardware if processing speed were an important factor. The test results histogram values from the histogram generator 28 are supplied to a difference taking algorithm 32. The difference taking algorithm 32 obtains its other input from a table of expected histogram values 30, and by subtracting those expected histogram values from the test results histogram values the difference algorithm 32 produces values for a variance histogram. The variance histogram values are then (optionally) compressed and/or encoded into a signature of the circuit under test.

Figure 23:
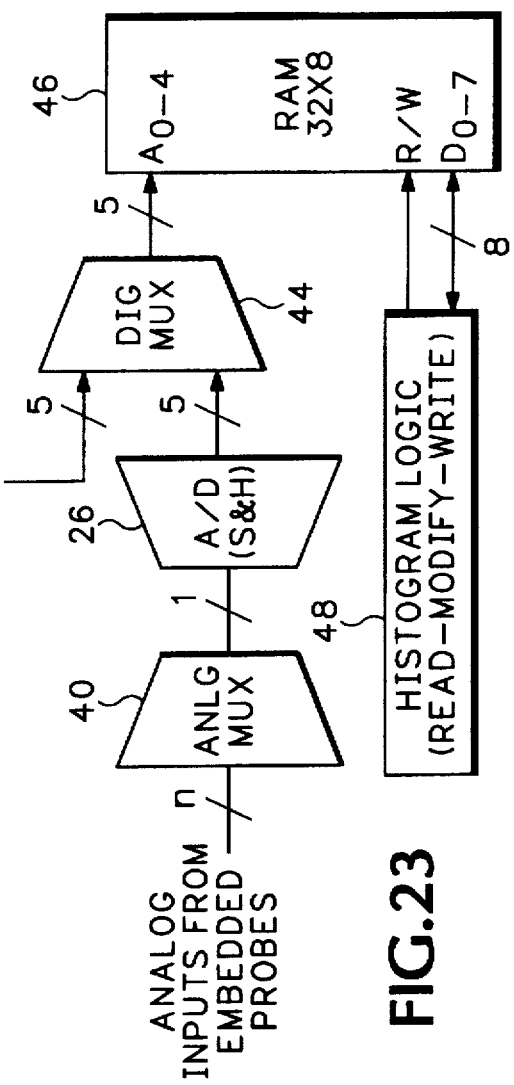
FIG. 23 is a detailed block diagram showing the circuitry in the environment of the A/D converter 26 and histogram generation block 28 of FIG. 22.

FIG. 23 is a detailed block diagram showing the circuitry in the environment of the A/D converter 26 and histogram generation block 28 of FIG. 22. At the left, a number n of analog inputs from embedded probes (such as those described in U.S. Pat. No. 5,418,470) are coupled to the inputs of analog multiplexer 40. The analog multiplexer 40 selects one of the analog inputs as its output. The output of the analog multiplexer 40 is connected to the input to A/D converter 26. The A/D converter 26 is shown as having a 5-bit output, so as to generate data for a 32-bin histogram, but this is a somewhat arbitrary design choice that could vary from application to application.

The 5-bit output of A/D converter 26 is one input to digital multiplexer 44. The other 5-bit input to digital multiplexer 44 is a set of digital samples that have been latched from the boundary scan bus (e.g., JTAG) that provides communications in this system for all of the built-in self-test resources. These digital samples might be from other A/D converters like 26 that are monitoring other analog signals-under-test located on other parts of the IC into which these resources have been built. Alternatively, the digital samples input to digital multiplexer 44 could be a test signal for verifying the operation of the RAM 46 and histogram logic 48 or for implementing a performance analyzer.

The 5-bit output of digital multiplexer 44 is applied to the address lines of (32×8) RAM 46. Each address represents one of the 32 bins in the test results histograms that are produced in accordance with the present invention. U.S. Pat. No. 4,774,681, incorporated by reference above, describes in more detail the operation of RAM 46 and Histogram Logic 48. As controlled by the test clock signal (shown in FIG. 25) that also controls the timing of sampling by the A/D converter 26, the histogram logic 48 performs a read-modify-write (increment) operation on the 8-bits of data stored at the address determined by the output of the digital multiplexer. This increments that data, thereby increasing the count in the histogram voltage level bin associated with the present address.

The method described above can employ a relatively simple A/D converter 26 to meet the necessary speed and accuracy requirements of a particular application. The on-chip histogram processor uses a minimal storage and processing facility to accomplish its task. No Waveform records are needed and no complex triggering circuits are needed. The software processing is similarly simple and straightforward.

A couple of things to note about histograms in this application: 1) They do not contain information about the sequential relationship of the sample values used, and therefore the samples can be randomly or algorithmicly acquired. 2) There may or may not be a synchronous relationship between a cause (stimulus) and effect (response) as presented by the histogram. That is, a histogram can be constructed from the actual signal present at the node under observation, or it could be constructed from a signal that results from an applied stimulus.

Because of these features of histograms, suitable results can be obtained in a variety of circumstances without any need for sequential real-time sampling or the need for sophisticated triggering resources. If the frequency of the signal under test is known, suitable histogram values can be obtained by equivalent time non-synchronous sampling if the sampling frequency is controlled sufficiently only to ensure that it is not synchronous with the frequency of the signal-under-test. ("Equivalent time" sampling is the sampling of repetitive waveforms a few points at a time at random times over many cycles.) If the signal-under-test has a trigger inherently associated with it and the available sampling frequency is relatively high compared with the frequency of that trigger, that trigger can be used to ensure that the high speed sampling is synchronized to and spread out over each period of the signal. If the frequency of the signal-under-test is too high, or not known, and if no inherent trigger signal is available, suitable samples may still be obtained by taking a large number of samples at random intervals over a large number of cycles of the signal-under-test.

In connection with the last approach given above, it should also be noted that the method of the present invention may be implemented in a piece-wise manner. This means that many partial results can accumulated and processed over time to produce an equivalent histogram that greatly exceeds the size of any histogram that could have been generated directly (given size constraints of the data fields, for instance).

While the embodiment of the invention described above is ideal for an embedded test application because it requires a relatively small amount of data for the export of results from within the integrated circuit, the invention can be used in other applications. In particular, the number of steps that are performed internally to the IC can be greatly varied without departing from the broadest conception of the invention. The analog electrical signal waveform under test can be exported and all of the steps of the analysis as described above can be performed externally to the integrated circuit. Or, digitization of the analog signal can be performed internally and all of the other steps can be performed externally. Or, the construction of the results histogram can also be performed internally, and then the results histogram can be exported to complete the procedure externally. Or, as described above, every step except the evaluation of the variance histogram can be performed internally to the IC, with only the evaluation being performed externally. Or, going even further, evaluation of the variance histogram can be performed internally, and only an error code needs to be exported.

Figure 24:
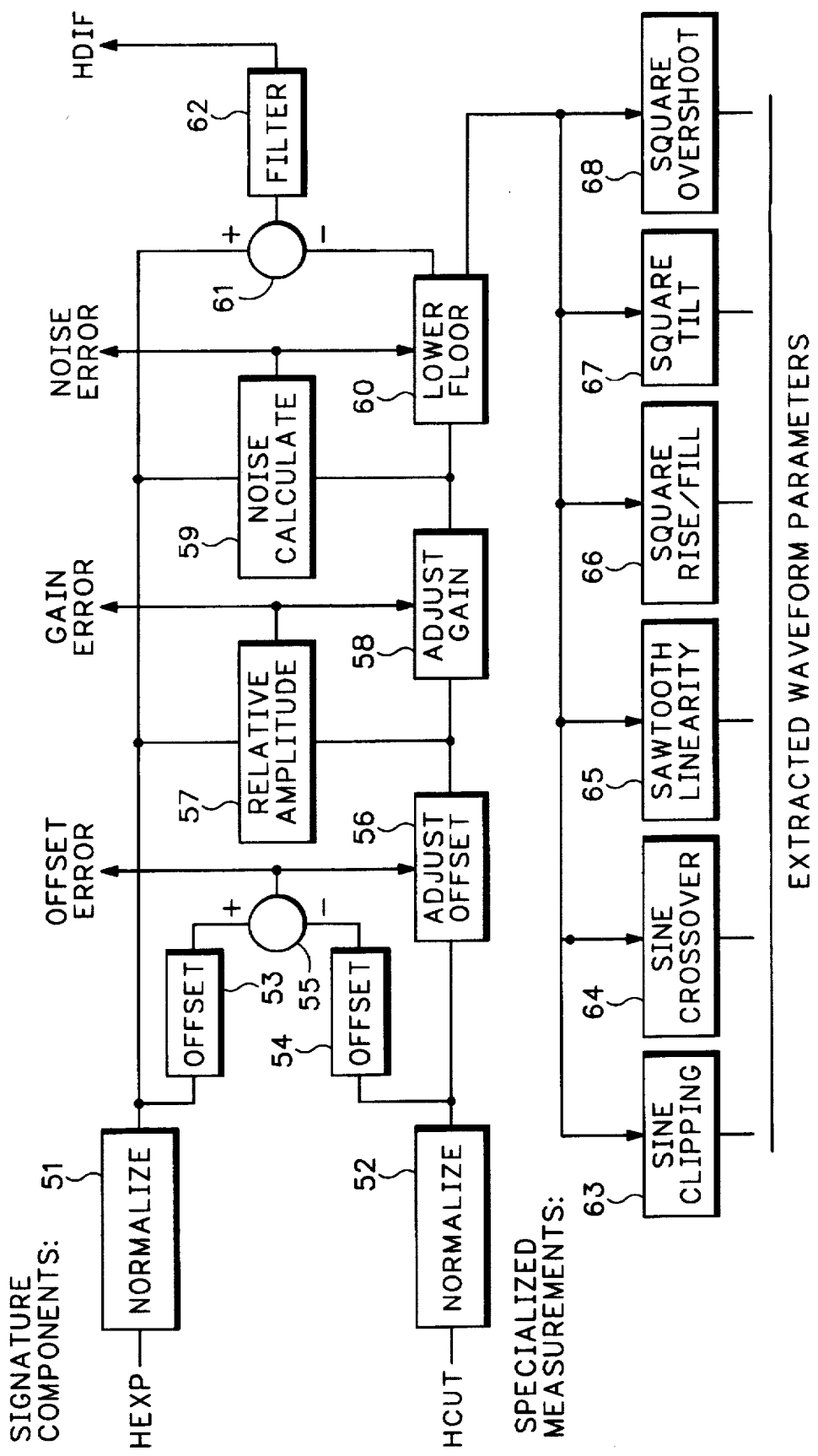
FIG. 24 is a conceptual block diagram illustrating the data flow and processing steps utilized by the software that supports the present invention.

FIG. 24 is a conceptual block diagram illustrating the data flow and processing steps utilized by the software that supports the present invention. The expected or reference histogram (HEXP) data and the test results histogram (HCUT) are first normalized 51,52 to make the sum of the data in all bins equal to one. Normalization eliminates variance in the histograms due to the number of samples taken. The resulting normalized data can be represented as an array of integers in which the binary point is at the most significant bit and the sum of the integer fractions equals one. In this form the data is compact and can be quickly manipulated using inexpensive processors that do not have to support floating point operations.

The HEXP (reference or "expected" histogram) data is next examined to determine the median bin number. The median bin number can be determined by a variety of procedures and can be conditioned by a desire to: a) minimize the RMS error of the difference histogram; b) minimize the maximum error of the difference histogram; c) minimize the average value of the varying component of the difference histogram; or d) a variety of other criteria.

As the result of a test being run, an HCUT (test results histogram for the circuit under test) is generated by the hardware and normalized 52 by the software. For the most accurate results, the hardware should continue to sample until one bin reaches maximum count. Normalization then puts the result in standard form for the calculations to follow. The next calculation after that determines the median bin or local offset 53 of the HCUT, conditioned by the same criterion used to determine the median bin number of the HEXP. The difference 55 between the median bin of the HCUT and the median bin of the HEXP represents the Offset Error. This Offset Error value can be part of the overall signature of data that characterizes the waveforms from the circuit under test. After determining the offset, it is used to offset adjust 56 the HCUT data until its median bin number is the same as that of the HEXP. This is usually necessary, since most of the measurements to follow would be adversely affected by the continuing existence of this offset.

The HEXP can now be subtracted 61 from the HCUT to produce a difference histogram (HDIF) directly. Or, as is shown in FIG. 24, further processing can be performed first. In the latter scenario, a gain adjustment 58 can be performed by determining the difference in signal amplitude 57 and scaling the HCUT data appropriately or by using successive approximation to adjust the HCUT data. The gain adjustment required 58 is another signal that can be exported as a "Gain Error" to characterize the waveform. The sequence of steps illustrated by FIG. 24 is somewhat arbitrary, in that other sequences of the same steps are in some cases equivalent. For example, the offset adjustment 56 can be performed after and be based on the difference or variance histogram HDIF, rather than being performed first as shown in FIG. 24.

Noise calculation 59 and the lowering of the floor 60 can be used to measure and cancel out "pop" type noise, while generating a Noise Error signal. "Pop" noise can alter the histogram in some cases by adding evenly to all bins. After measuring this type of noise 59, it can be compensated for by subtracting 60 this "floor" value from all bins before taking the difference between histograms to produce the difference histogram (HDIF).

If the waveform being measured has a simple mathematical representation, as does a sinewave, a squarewave, or a sawtooth waveform, additional measurement that can be made on the HCUT may eliminate the need for generating a difference histogram. While quantitative error values can be determined for such waveforms, these values are not readily comparable with standard measurement techniques. Therefore, this type of measurement works best when the values obtained are compared with the comparable values from reference ("golden") circuits or a theoretically ideal waveform.

For a sinewave, it is possible to measure clipping 63 and crossover distortion 64 by analyzing the bins at the voltage extremes and the center. In some cases it should be possible to measure harmonic distortion by examining the shape of the test results histogram. For a squarewave, the risetime/falltime 66 can best be determined by examining the central bins of the histogram, and over/under-shoot 68 can best be determined by examining the bins at the voltage extremes, while tilt can be measured 67 by examining the bins between the voltage extremes. Similarly, the linearity of a sawtooth ramp signal can be determined 65 by examination of the center bins. For more complex and less straightforward waveforms, the best reference histogram is generally obtained from a "golden" or reference device or circuit.

After performing any or all of the corrections described above to the HCUT, a figure of merit can be determined from the difference histograms. The calculation of this figure of merit can be weighted so that differences in the more critical voltage areas have greater significance in producing the result. In some circumstances, such figures of merit alone can be exported from the integrated circuit to adequately characterize the operation of the circuit under test.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the broadest legal definition of the invention.

We claim:

1. A method for evaluating an electrical signal, the method comprising the steps of:

preparing a reference histogram, the reference histogram consisting of values each representing the number of times that a desired electrical signal if sampled would produce voltages within a particular range of a set of quantized ranges of voltage values;

sampling the electrical signal and converting each sample to a digital voltage value;

constructing from the digital sample values a test results histogram, the test results histogram consisting of values each representing the number of digital voltage values from the sampled electrical signal that were within a particular range of a set of quantized ranges of voltage values;

subtracting the values of the reference histogram from the corresponding values of the test results histogram to produce values for a variance histogram; and evaluating the values of the variance histogram to determine characteristics of the electrical signal relative to the desired electrical signal; and wherein the sampling step and constructing step are performed internally to an integrated circuit and the steps of subtracting and evaluating are performed externally to the integrated circuit, and wherein the method further comprises the step of exporting the test results histogram.

2. A method according to claim 1 wherein the reference histogram is prepared by the steps of:

sampling a desired electrical signal and converting each sample to a digital value; and building from the digital sample values a reference histogram, the reference histogram consisting of values each representing the number of digital voltage values from the desired electrical signal that were within a particular range of a set of quantized ranges of voltage values.

3. A method according to claim 1 wherein the reference histogram is prepared by the steps of:

simulating a desired electrical signal to produce digital sample values; and building from the digital sample values a reference histogram, the reference histogram consisting of values each representing the number of digital voltage values from the desired electrical signal that were within a particular range of a set of quantized ranges of voltage values.

4. A method according to claim 1 wherein the steps of sampling, constructing, subtracting, and evaluating are performed internally to an integrated circuit, and the method further comprises the step of exporting a summary of the evaluation.

5. A method for determining characteristics of an electrical signal to be evaluated relative to a desired electrical signal, the method comprising the steps of:

using the desired electrical signal to produce a reference histogram;

sampling the electrical signal to be evaluated to produce a series of digital voltage values;

producing a test results histogram from the series of digital voltage values;

normalizing the reference histogram and the test results histogram as necessary; and comparing the test results histogram and the reference histogram to produce an evaluation result; and wherein the comparing step comprises the step of:

taking the difference between the test results histogram and the reference histogram to produce a variance histogram.

6. A method according to claim 5 further comprising the step of:

using the variance histogram to determine an offset between the test results histogram and the reference histogram.

7. A method according to claim 6 further comprising the step of:

making a gain adjustment to the test results histogram.

8. A method according to claim 6 further comprising the step of:

calculating a noise floor adjustment to the test results histogram.

9. A method according to claim 5 further comprising the steps of:

adjusting an offset of the test results histogram to match an offset of the reference histogram; and determining an offset error from the adjustment of the offset of the test results histogram, wherein the adjusting and determining steps are performed before the comparing step.

10. A method according to claim 9 further comprising the step:

making a gain adjustment to the test results histogram.

11. A method according to claim 9 further comprising the step of:

calculating a noise floor adjustment to the test results histogram.

12. A method according to claim 5 further comprising the step of:

making a gain adjustment to the test results histogram.

13. A method according to claim 5 further comprising the step of:

calculating a noise floor adjustment to the test results histogram.

14. A method for determining characteristics of an electrical signal to be evaluated relative to a desired electrical signal, the method comprising the steps of:

using the desired electrical signal to produce a reference histogram;

sampling the electrical signal to be evaluated to produce a series of digital voltage values;

producing a test results histogram from the series of digital voltage values;

normalizing the reference histogram and the test results histogram as necessary; and comparing the test results histogram and the reference histogram to produce an evaluation result; and further comprising the steps of:

adjusting an offset of the test results histogram to match an offset of the reference histogram; and determining an offset error from the adjustment of the offset of the test results histogram, wherein the adjusting and determining steps are performed before the comparing step.

15. A method according to claim 6 further comprising the step of:

making a gain adjustment to the test results histogram.

16. A method according to claim 14 further comprising the step of:

calculating a noise floor adjustment to the test results histogram.

17. A method for determining characteristics of an electrical signal to be evaluated relative to a desired electrical signal, the method comprising the steps of:

using the desired electrical signal to produce a reference histogram;

sampling the electrical signal to be evaluated to produce a series of digital voltage values;

producing a test results histogram from the series of digital voltage values;

normalizing the reference histogram and the test results histogram as necessary; and comparing the test results histogram and the reference histogram to produce an evaluation result: and further comprising the step of:

making a gain adjustment to the test results histogram.

18. A method for determining characteristics of an electrical signal to be evaluated relative to a desired electrical signal, the method comprising the steps of:

using the desired electrical signal to produce a reference histogram;

sampling the electrical signal to be evaluated to produce a series of digital voltage values;

producing a test results histogram from the series of digital voltage values;

normalizing the reference histogram and the test results histogram as necessary; and comparing the test results histogram and the reference histogram to produce an evaluation result; and further comprising the step of:

calculating a noise floor adjustment to the test results histogram.

* * * * *